United States Patent
Loccufier et al.

(10) Patent No.: US 9,329,479 B2
(45) Date of Patent: May 3, 2016

(54) LITHOGRAPHIC PRINTING PLATE PRECUSOR

(71) Applicant: AGFA GRAPHICS NV, Mortsel (BE)

(72) Inventors: Johan Loccufier, Mortsel (BE); Marin Steenackers, Mortsel (BE); Sam Verbrugghe, Mortsel (BE)

(73) Assignee: AGFA GRAPHICS NV, Mortsel (BE)

( * ) Notice: Subject to any disclaimer, the term of this patent is extended or adjusted under 35 U.S.C. 154(b) by 0 days.

(21) Appl. No.: 14/390,427

(22) PCT Filed: Mar. 20, 2013

(86) PCT No.: PCT/EP2013/055773
§ 371 (c)(1),
(2) Date: Oct. 3, 2014

(87) PCT Pub. No.: WO2013/182328
PCT Pub. Date: Dec. 12, 2013

(65) Prior Publication Data
US 2015/0168837 A1    Jun. 18, 2015

Related U.S. Application Data

(60) Provisional application No. 61/656,521, filed on Jun. 7, 2012.

(30) Foreign Application Priority Data

Jun. 5, 2012 (EP) .................................... 12170799

(51) Int. Cl.
| | | |
|---|---|---|
| *G03F 7/30* | (2006.01) | |
| *G03F 7/075* | (2006.01) | |
| *B41C 1/10* | (2006.01) | |
| *G03F 7/027* | (2006.01) | |
| *G03F 7/11* | (2006.01) | |
| *G03F 7/40* | (2006.01) | |
| *G03F 7/004* | (2006.01) | |

(52) U.S. Cl.
CPC ............ *G03F 7/0757* (2013.01); *B41C 1/1008* (2013.01); *B41C 1/1016* (2013.01); *G03F 7/004* (2013.01); *G03F 7/027* (2013.01); *G03F 7/0751* (2013.01); *G03F 7/0752* (2013.01); *G03F 7/11* (2013.01); *G03F 7/30* (2013.01); *G03F 7/405* (2013.01); *B41C 2201/04* (2013.01); *B41C 2201/10* (2013.01); *B41C 2201/14* (2013.01); *B41C 2210/04* (2013.01); *B41C 2210/06* (2013.01); *B41C 2210/20* (2013.01); *B41C 2210/22* (2013.01); *B41C 2210/24* (2013.01); *B41C 2210/26* (2013.01)

(58) Field of Classification Search
CPC ........................................................ G03F 7/00
USPC ............................................................ 430/302
See application file for complete search history.

(56) References Cited

U.S. PATENT DOCUMENTS

| | | | |
|---|---|---|---|
| 5,204,143 A | 4/1993 | Nishimiya et al. | |
| 5,807,659 A | 9/1998 | Nishimiya et al. | |
| 6,030,748 A | 2/2000 | Nishimiya et al. | |
| 7,553,607 B2 * | 6/2009 | Fiebag et al. | 430/302 |
| 2007/0003866 A1* | 1/2007 | Takamuki | 430/270.1 |

FOREIGN PATENT DOCUMENTS

| | | | | |
|---|---|---|---|---|
| EP | 0 256 256 A2 | 2/1988 | | |
| EP | 0 418 575 A2 | 3/1991 | | |
| EP | 0 466 070 A2 | 1/1992 | | |
| EP | 1 543 958 A2 | 6/2005 | | |
| EP | 1543958 A2 * | 6/2005 | | B41C 1/10 |
| WO | 2006/021446 A1 | 3/2006 | | |
| WO | 2006/077048 A2 | 7/2006 | | |
| WO | 2009/154740 A1 | 12/2009 | | |

OTHER PUBLICATIONS

Official Communication issued in International Patent Application No. PCT/EP2013/055773, mailed on Jun. 14, 2013.

* cited by examiner

*Primary Examiner* — Chanceity Robinson
(74) *Attorney, Agent, or Firm* — Keating and Bennett, LLP

(57) ABSTRACT

A negative-working lithographic printing plate precursor includes a coating containing a photopolymerizable layer and optionally an intermediate layer between the photopolymerizable layer and the support, wherein the coating further includes a polysiloxane, the polysiloxane being present in the photopolymerizable layer and/or in the optional intermediate layer, and the polysiloxane is obtained by reacting at least one organosilicon compound represented by the general Formula (I) and at least one organosilicon compound represented by the general Formula (II):

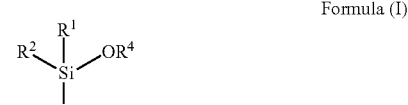

Formula (I)

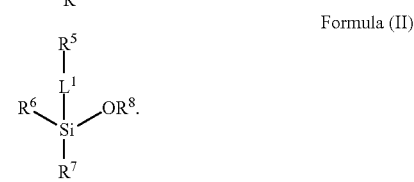

Formula (II)

10 Claims, No Drawings

LITHOGRAPHIC PRINTING PLATE PRECUSOR

CROSS-REFERENCE TO RELATED APPLICATIONS

This application is a 371 National Stage Application of PCT/EP2013/055773, filed Mar. 20, 2013. This application claims the benefit of U.S. Provisional Application No. 61/656,521, filed Jun. 7, 2012, which is incorporated by reference herein in its entirety. In addition, this application claims the benefit of European Application No. 12170799.6, filed Jun. 5, 2012, which is also incorporated by reference herein in its entirety.

BACKGROUND OF THE INVENTION

1. Field of the Invention

The present invention relates to a negative-working lithographic printing plate precursor comprising a novel polysiloxane.

2. Description of the Related Art

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

The so-called "analogue" printing plates are generally obtained by first applying a so-called computer-to-film (CtF) method, wherein various pre-press steps such as typeface selection, scanning, color separation, screening, trapping, layout and imposition are accomplished digitally and each color selection is transferred to graphic arts film using an imagesetter. After processing, the film can be used as a mask for the exposure of an imaging material called plate precursor and after plate processing, a printing plate is obtained which can be used as a master. Since about 1995, the so-called "computer-to-plate" (CtP) method has gained a lot of interest. This method, also called "direct-to-plate", bypasses the creation of film because the digital document is transferred directly to a printing plate precursor by means of a platesetter. A printing plate precursor for CtP is often called a digital plate.

Digital plates can roughly be divided in three categories: (i) silver plates, working according to the silver salt diffusion transfer mechanism; (ii) photopolymer plates containing a photopolymerizable composition that hardens upon exposure to light and (iii) thermal plates of which the imaging mechanism is triggered by heat or by light-to-heat conversion.

Photopolymer plate precursors can be sensitized by blue, green or red light (i.e. wavelength range between 450 and 750 nm), by violet light (i.e. wavelength range between 350 and 450 nm) or by infrared light (i.e. wavelength range between 750 and 1500 nm). Lasers have become the predominant light source used to expose photopolymer printing plate precursors. Typically, an Ar laser (488 nm) or a FD-YAG laser (532 nm) can be used for exposing a visible light sensitized photopolymer plate precursor. The wide-scale availability of low cost blue or violet laser diodes, originally developed for data storage by means of DVD, has enabled the production of platesetters operating at shorter wavelength. More specifically, semiconductor lasers emitting from 350 to 450 nm have been realized using an InGaN material. For this reason, photopolymer plates having their maximal sensitivity in the 350 nm to 450 nm region have been developed during the last years. An advantage of violet photopolymer technology is the reliability of the laser source and the possibility of handling the non-developed photopolymer plate precursors in yellow safelight conditions. The use of infrared lasers also became more important in the last years, for example the Nd-YAG laser emitting around 1060 nm but especially the infrared laser diode emitting around 830 nm. For these laser sources, infrared sensitive photopolymer plate precursors have been developed. The major advantage of infrared photopolymer technology is the possibility to handle the non-developed photopolymer plate precursors in daylight conditions.

Typically, a photopolymer plate precursor contains a photopolymerizable coating including a polymerizable compound, a polymerization initiator and a binder.

The support of the lithographic printing plates are typically aluminum supports which have a hydrophilic surface or on which a hydrophilic layer has been provided. This hydrophilic surface and/or layer should improve the water acceptance of the non-printing areas of a lithographic printing plate and the repulsion of the printing ink in these areas. During developing the soluble portions of the photopolymerizable coating should be easily removed whereby the surface of the support remains residue-free so that clean background areas are obtained during printing. Without such a residue-free removal, so-called toning would occur during printing, i.e. the background areas would accept printing ink. However, at the same time the adhesion of the image-areas on the aluminum surface should be as high as possible. Therefore, in the art there have been several technological developments, trying to solve these issues. In several approaches, reactive interlayers or sublayers and/or support treatments have been designed to optimize the lithographic contrast by increasing the hydrophobicity and/or adhesion at the image-areas, while remaining or increasing the hydrophilicity at the non-image areas.

EP 256 256 discloses a method to produce a grained and anodized aluminum substrate which is surface treated with a hydrolyzed and condensed silane for printing plate applications.

U.S. Pat. No. 6,030,748 discloses a photosensitive lithographic printing plate having an intermediate layer between the photosensitive layer and the substrate including an inorganic polymer obtained by hydrolysis and polycondensation of a specific silane coupling agent in a solution containing a phenol having a molecular weight of 1000 or less or an organic phosphoric acid compound.

EP 418 575 discloses the surface treatment of a grained and anodized aluminum substrate with a mixture of a fluoride and a hydrolyzed and condensed silane.

U.S. Pat. No. 5,807,659 discloses a negative working lithographic printing plate, wherein the lithographic support is functionalized with a group having an unsatured bond, capable of undergoing a radical addition reaction, and a silicium atom which is covalently bonded to an aluminum atom or a carbon atom of the support via an oxygen atom.

WO 2009/154740 discloses a substrate provided with an interlayer including a specific trialkoxysilane polyethylene glycol acrylate.

U.S. Pat. No. 5,204,143 discloses a process for functionalizing a grained and anodized aluminum by treating its surface with a solution containing an inorganic polymer obtained by hydrolysis and polycondensation of an organometallic compound including an organic functional group.

WO 2006/021446 discloses phosphono-substituted siloxanes including a secundary or tertiary amino group as hydrophylic layer on an aluminum oxide support. WO 2006/077048 discloses phosphono-substituted siloxanes including a secundary or tertiary amino group suitable as interlayer material in lithographic substrates and for post-treating developed lithographic printing plates.

All the above discussed approaches to improve lithographic properties are focused on a separate surface treatment of a lithographic support and/or on the design of an intermediate layer on the lithographic surface. The surface treatment of a support and the application of an intermediate layer on the surface of a support which involves an additional coating step from a solvent, are both cumbersome operations. Therefore, from both a practical and an economical point of view, it would be advantageous to have printing plates based on photopolymerisation which have an improved lithographic latitude without the need for an additional treatment of the grained and anodized aluminium support and/or for an extra layer between the support and the photopolymer layer.

SUMMARY OF THE INVENTION

Preferred embodiments of the present invention provide a negative-working lithographic printing plate precursor including a photopolymerizable layer which provides a printing plate with excellent lithographic properties i.e. a plate which combines a good adhesion of the image areas with a good developability of the non-image areas.

A preferred embodiment of the present invention provides a negative-working lithographic printing plate precursor comprising a support having a hydrophilic surface or which is provided with a hydrophilic layer, a coating on the support including a photopolymerizable layer and optionally an intermediate layer between the photopolymerizable layer and the support, wherein the coating further comprises a polysiloxane, said polysiloxane being present in the photopolymerizable layer and/or in the optionally intermediate layer, characterized in that the polysiloxane is obtainable by reacting at least one organosilicon compound represented by the general Formula (I) and at least one organosilicon compound represented by the general Formula (II):

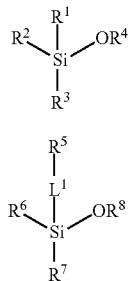

Formula (I)

Formula (II)

wherein
R¹ represents a group including at least one free radical polymerisable group;

R², R³, R⁶ and R⁷ independently represent an alkoxy, aryloxy or an acyloxy group, an optionally substituted alkyl, cycloalkyl, alkenyl, alkynyl, aryl or heteroaryl group;

R⁴ and R⁸ independently represent an optionally substituted alkyl, cycloalkyl, alkenyl, alkynyl, aryl, heteroaryl group or acyl group;

L¹ represents a di- or trivalent linking group; and

R⁵ represents hydrophilic group selected from a carboxylic acid or a salt thereof, a sulphonic acid or a salt thereof, or a sulphuric acid or a monoester or a salt thereof, a hydrocarbon group substituted with at least one hydroxyl group, an oligoalkylene oxide group, a quaternary ammonium group, a phosphonium group, or combinations thereof;

with the proviso that R¹ and L¹ are bonded to the silicium atom via a carbon atom.

The printing plates based on the precursors including the polysiloxane according to preferred embodiments of the invention, exhibit an excellent lithographic quality resulting in a printing plate showing no stain on the plate after processing and no toning during printing. This means that the coating at the non-exposed area is sufficiently removed from the support such that there is no tendency of accepting ink on these areas during the printing process. Furthermore, the polysiloxanes according to preferred embodiments of the invention significantly improve the durability of the plate in the printing process.

Other features, elements, steps, characteristics and advantages of the present invention will become more apparent from the following detailed description of preferred embodiments of the present invention. Specific embodiments of the invention are also defined in the dependent claims.

DETAILED DESCRIPTION OF THE PREFERRED EMBODIMENTS

The polysiloxane according to a preferred embodiment of the present invention is obtainable by reacting at least one organosilicon compound of the general Formula (I) and at least one organosilicon compound of the general Formula (II). The organosilicon compound of Formula (I) is represented by the following formula:

Formula (I)

wherein
R¹ represents a group including at least one free radical polymerisable group, R² and R³ independently represent an alkoxy group such as a methoxy or an ethoxy group, an aryloxy or an acyloxy group, an optionally substituted alkyl, cycloalkyl, alkenyl, alkynyl, aryl or heteroaryl group; and R⁴ represents an optionally substituted alkyl, cycloalkyl, alkenyl, alkynyl, aryl, heteroaryl group or acyl group;

with the proviso that that R¹ is bonded to the silicium atom via a carbon atom.

Preferably, R² and R³ independently represent an alkoxy or an aryloxy group. R² and R³ most preferably independently represent a methoxy or an ethoxy group. R⁴ preferably represents an optionally substituted alkyl group such as an optionally substituted methyl, ethyl, propyl, isopropyl, butyl, isobutyl or pentyl group. Most preferably, R⁴ represents a methyl or an ethyl group.

The optionally substituted acyl group represents for example an alkylcarbonyl group having 1 to 30 carbon atoms, an arylcarbonyl group having 7 to 30 carbon atoms, or a heterocyclic carbonyl group having 4 to 30 carbon atoms in which the heterocyclic group is connected to the carbonyl group with its carbon atom. Suitable examples include an acetyl, pivaloyl, 2-chloroacetyl, stearoyl, benzoyl or a 2-pyridylcarbonyl group.

The group $R^1$ includes at least one free radical polymerisable group; $R^1$ may include 1 to 15 free radical polymerisable groups, preferably 1 to 10 free radical polymerisable groups and more preferably $R^1$ includes 1, 2, 3, 3 or 5 free radical polymerisable groups. The free radical polymerisable group is preferably represented by an ethylenical unsaturated group. The ethylenical unsaturated group preferably represents an optionally substituted acrylate, methacrylate, acrylamide, methacrylamide, styryl or vinyl group. Acrylates and methacrylates are also referred to as (meth)acrylates; acrylamides and methacrylamides are also referred to as (meth)acrylamides. The optional substituents on the (meth)acrylate, (meth)acrylamide, vinyl or styryl group may represent hydrogen, an alkyl group such as a methyl or ethyl group, or a methyl acetyl group or ethyl acetyl group.

Preferably, $R^1$ includes besides at least one free radical polymerisable group, at least one optionally substituted divalent linking group or spacer such as a alkylene group, an arylene group, a heteroarylene group or a (poly)alkylene oxide group, such as a (poly)ethylene oxide group, or combinations thereof. Preferred optional substituents are an alkyl group such as a methyl, ethyl propyl or isopropyl group, or one or more hydroxyl groups. $R^1$ may include no or 1 to 15 divalent linking groups, preferably 1 to 10 and more preferably 1, 2, 3, 4 or 5 divalent linking groups. Preferably, $R^1$ includes at least one (poly)ethylene oxide group which is preferably represented by $-(O-CH_2-CH_2)_a-$ wherein a is an integer ranging from 1 to 25, preferably an integer ranging from 1 to 20, more preferably an integer ranging from 1 to 15. Most preferably, a represents 1, 2, 3, 4, 5, 6, 7, 8, 9 or 10.

Suitable examples of the (meth)acrylates representing the ethylenical unsaturated group are for example groups derived from an alkyl (meth)acrylate or cycloalkyl (meth)acrylate preferably having from 1 to 20 carbon atoms in the alkyl group or the cycloalkyl group thereof, for example, groups derived from methyl (meth)acrylate, ethyl (meth)acrylate, propyl (meth)acrylate, isopropyl (meth)acrylate, butyl (meth) acrylate, 4-hydroxybutyl (meth) acrylate, isopentyl(meth) acrylate, hexyl (meth)acrylate, cyclohexyl (meth)acrylate, octyl (meth)acrylate, chloroethyl (meth) acrylate, diethylether (meth) acrylate, dipropylether (meth)acrylate, dibutylether (meth)acrylate, hydroxypentyl (meth)acrylate or groups derived from aryl (meth)acrylate, for example, groups derived from phenyl (meth) acrylate, benzyl (meth) acrylate, methoxybenzyl (meth)acrylate, cresyl (meth)acrylate, tolyl (meth)acrylate, naphthyl (meth)acrylate) or chlorobenzyl (meth)acrylate; and groups derived from heteroaryl (meth) acrylate, for example, groups derived from furfuryl methacrylate or tetrahydrofurfuryl (meth) acrylate.

Most preferred are groups derived from alkyl (meth) acrylates.

Suitable examples of the (meth)acrylamides representing the ethylenical unsaturated group are for example groups derived from alkyl (meth)acrylamide or cycloalkyl (meth) acrylamide preferably having from 1 to 20 carbon atoms in the alkyl group or the cycloalkyl group thereof, for example, methyl (meth)acrylamide, ethyl (meth)acrylamide, propyl (meth) acrylamide, isopropyl (meth) acrylamide, butyl (meth)acrylamide, 4-hydroxybutyl (meth)acrylamide, isopentyl (meth)acrylamide, hexyl (meth)acrylamide, cyclohexyl (meth)acrylamide, ethylhexyl (meth)acrylamide, octyl (meth)acrylamide, chloroethyl (meth)acrylamide, diethylether (meth)acrylamide, dipropylether (meth)acrylamide, dibutylether (meth)acrylamide, hydroxypentyl (meth)acrylamide or groups derived from aryl (meth)acrylamide, for example, groups derived from phenyl (meth)acrylate, benzyl (meth)acrylamide, methoxybenzyl (meth)acrylamide, cresyl (meth)acrylamide, tolyl (meth)acrylamide, naphthyl (meth) acrylamide or chlorobenzyl (meth)acrylamide; and groups derived from heteroaryl (meth)acrylamide, for example, groups derived from furfuryl (meth)acrylamide or tetrahydrofurfuryl (meth)acrylamide.

Most preferred is a group derived from alkyl (meth) acrylamide.

Suitable examples of organosilicon compounds of the general Formula (I) are, without being limited thereto, given in the Table A below.

TABLE A

Suitable examples of organosilicon compounds of the general Formula (I)

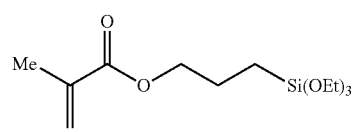

I-1

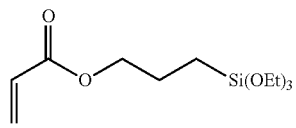

I-2

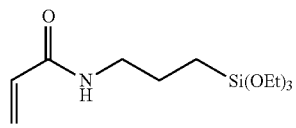

I-3

TABLE A-continued
Suitable examples of organosilicon compounds of the general Formula (I)
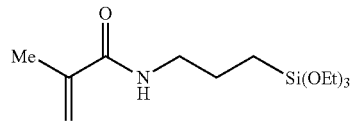
I-4
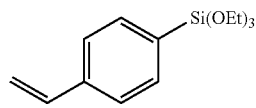
I-5
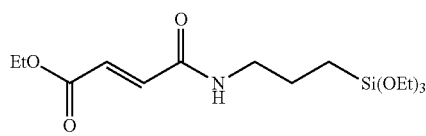
I-6
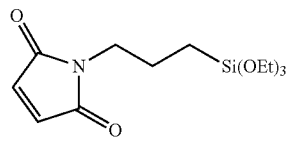
I-7
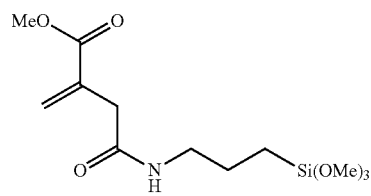
I-8
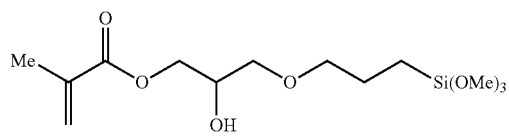
I-9
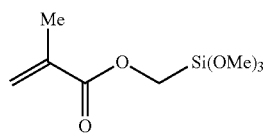
I-10
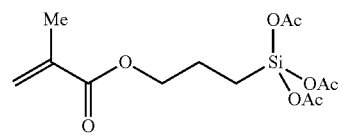 [SMILES: C=C(C)C(=O)OCCC[Si](OC(C)=O)(OC(C)=O)OC(C)=O]
I-11
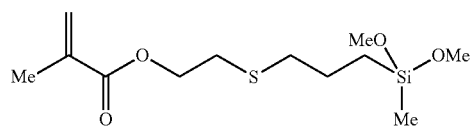 [SMILES: C=C(C)C(=O)OCCSCCC[Si](C)(OC)OC]
I-12
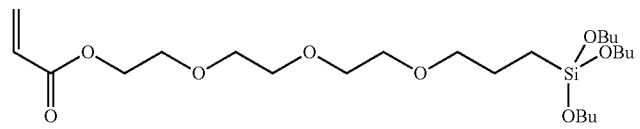
I-13

TABLE A-continued
Suitable examples of organosilicon compounds of the general Formula (I)
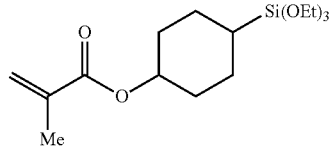 I-14
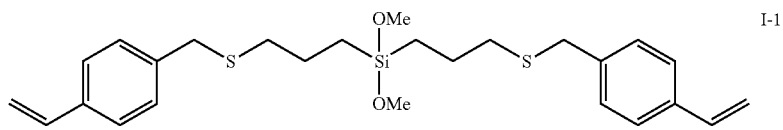 I-15
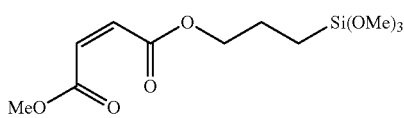 I-16
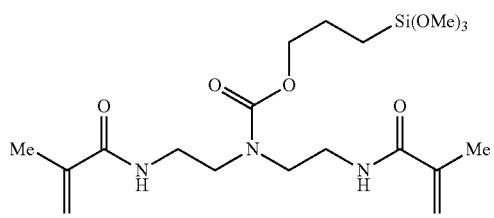 I-17
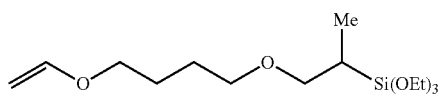 I-18
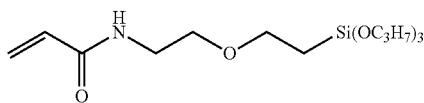 I-19
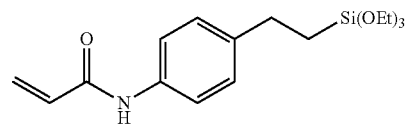 I-20
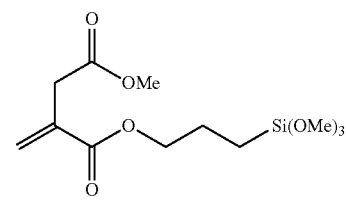 I-21
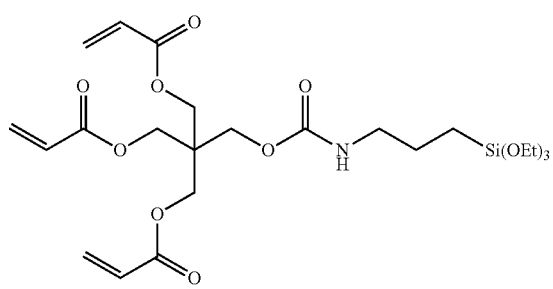 I-22

TABLE A-continued
Suitable examples of organosilicon compounds of the general Formula (I)
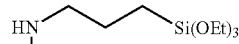 I-23
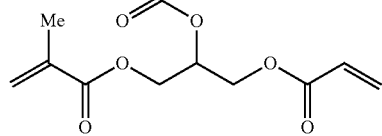
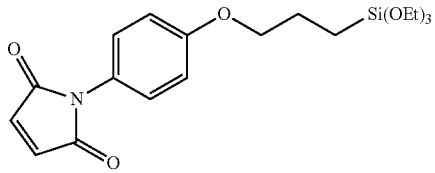 I-24
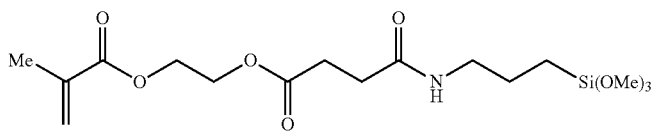 I-25
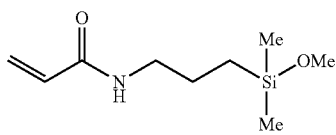 I-26
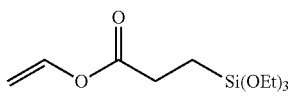 I-27
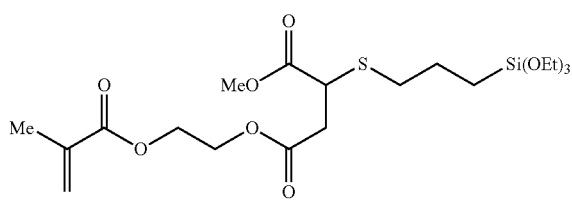 I-28
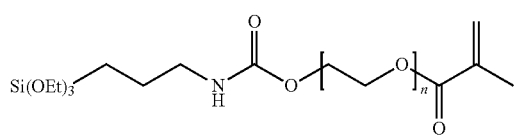 I-29
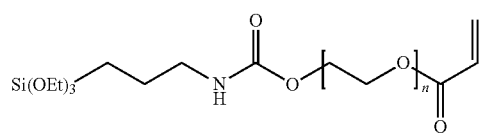 I-30

TABLE A-continued
Suitable examples of organosilicon compounds of the general Formula (I)
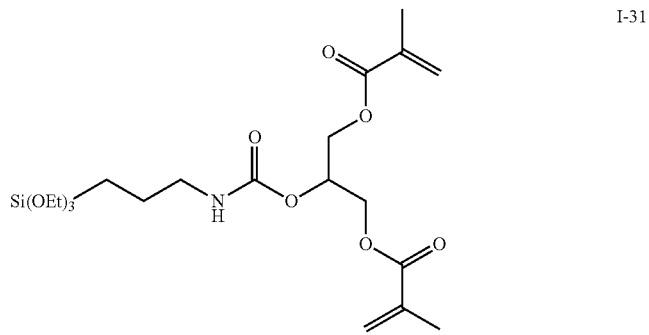
I-31
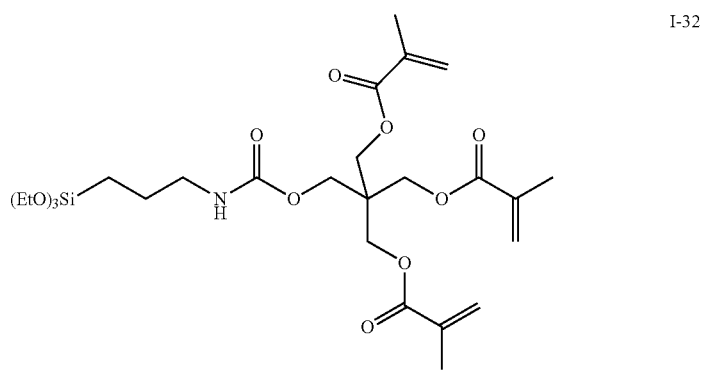
I-32
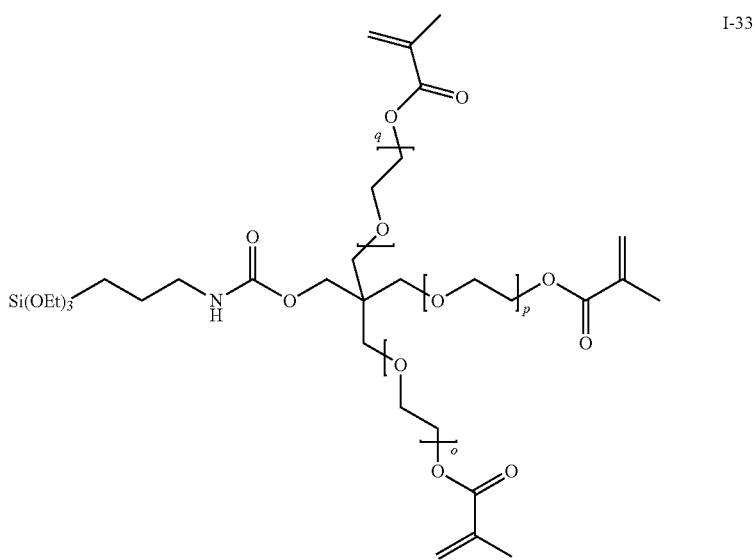
I-33

TABLE A-continued

Suitable examples of organosilicon compounds of the general Formula (I)

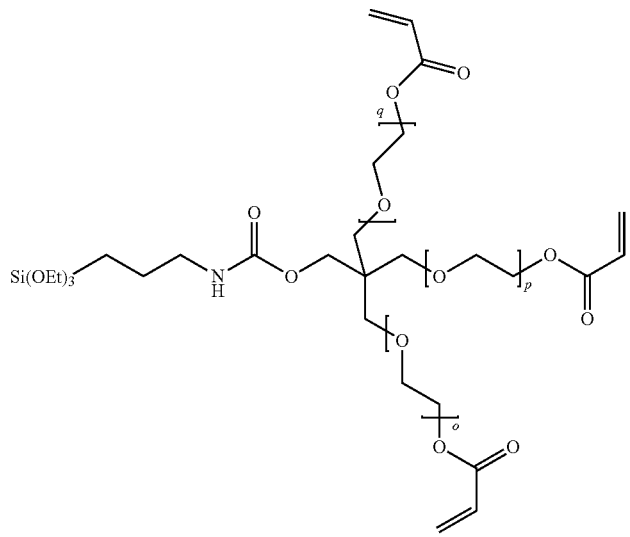

I-34

I-35

Wherein n, o, p and q in the above structures independently represent an integer from 1 to 40, preferably an integer ranging from 1 to 20, more preferably an integer ranging from 1 to 15. Most preferably, n, o, p and q independently represent 1, 2, 3, 4, 5, 6, 7, 8, 9 or 10.

The organosilicon compound of Formula (II) is represented by the following formula:

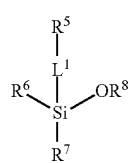

Formula (II)

wherein $R^5$ represents a hydrophylic group selected from a carboxylic acid or a salt thereof, sulphonic acid or a salt thereof, a sulphuric acid or a monoester or a salt thereof, a hydrocarbon group substituted with at least one hydroxyl group, an oligoalkylene oxide group such as an ethylene oxide containing 1 to 120 alkylene oxide units, a quaternary ammonium group or a phosphonium group; or combinations thereof;

$L^1$ represents a di- or trivalent linking group;

$R^6$ and $R^7$ independently represent an alkoxy such as a methoxy or ethoxy group, aryloxy or an acyloxy group, an optionally substituted alkyl, cycloalkyl, alkenyl, alkynyl, aryl or heteroaryl group; and $R^8$ represents an optionally substituted alkyl, cycloalkyl, alkenyl, alkynyl, aryl, heteroaryl or acyl group.

Preferably, the hydrophylic group $R^5$ is represented by carboxylic acid, a hydrocarbon group substituted with at least one hydroxyl group, or an ethylene oxide group, or combinations thereof. The ethylene oxide group preferably represents —(O—CH$_2$—CH$_2$)$_a$— with a preferably equal to 1 to 20, more preferably, a is equal to 2 to 10 and most preferably a is equal to 3 to 8.

More preferably, the hydrophylic group $R^5$ is represented by a hydrocarbon group substituted with at least one hydroxyl group. The hydrocarbon group substituted with at least one hydroxyl group is preferably an alkyl, an aryl or an aralkyl group substituted with at least one hydroxyl group.

Most preferably, the hydrophylic group $R^5$ is represented by an alkyl group substituted with at least one hydroxyl group.

The alkyl group substituted with at least one hydroxyl group is preferably selected from 1-hydroxypropyl, 1,2-dihydroxypropyl, 2,2-dimethylhydroxypropyl 5-hydroxypentyl, trimetylolpropane, hydroxyhexyl, hydroxyethyl, polyhydroxybutyl, polyhydroxypentyl or polyhydroxyhexyl.

$R^8$ preferably represents an optionally substituted alkyl group such as an optionally substituted methyl, ethyl, propyl, isopropyl, butyl, isobutyl or pentyl group. Most preferably, $R^8$ represents a methyl or an ethyl group.

The optionally substituted acyl group represents for example an alkylcarbonyl group having 1 to 30 carbon atoms, an arylcarbonyl group having 7 to 30 carbon atoms, or a heterocyclic carbonyl group having 4 to 30 carbon atoms in which the heterocyclic group is connected to the carbonyl group with its carbon atom. Suitable examples include an acetyl, pivaloyl, 2-chloroacetyl, stearoyl, benzoyl or a 2-pyridylcarbonyl group.

Preferably, $L^1$ represents an aliphatic group or an aliphatic group containing a functional group selected from an ether, a thioether, an ester, a ketone, a urethane, an amide, an urea or thio-ureum group.

More preferably, $L^1$ represents an alkylene represented by —$(CH_2)_k$—, a cycloalkylene, an arylene having preferably from 5 to 15 carbon atoms, more preferably from 6 to 10 carbon atoms, such as for example a phenylene group, a xylylene group, a naphthylene group and an anthrylene group, a heteroarylene, —O—$(CH_2)_k$—, —S—$(CH_2)_k$—, —$(CH_2)_k$—O—CO—$(CH_2)_l$—, —CS—$(CH_2)_k$—, —CO—$(CH_2)_k$—, —O—CO—NH—, —$(CH_2)_k$—CO—NH—, —$(CH_2)_k$—NH—CO—, —NR*—CO—NH—, >N—CO—NH—, —NR*—CS—NH—, or combinations thereof and wherein k and l independently represent O, 1, or an integer greater than 1 and R* represents hydrogen or an alkyl group such as an methyl, ethyl, propyl, isopropyl, butyl, isobutyl or pentyl group. Preferably R* represents hydrogen or a methyl group. Preferably k and l independently represent an integer selected from to 1 to 20, more preferably k and l independently represent an integer selected from 1 to 10, most preferably an integer selected from 2, 3, 4, 5 or 6. The linking groups may optionally have substituents.

Preferably, $L^1$ represents a di- or trivalent linking group selected from an alkylene represented by —$(CH_2)_k$—, —O—$(CH_2)_k$—, —S—$(CH_2)_k$—, —NH—CO—, —$(CH_2)_k$—NH—CO—, —NR*—CO—NH—, >N—CO—NH— or combinations thereof and wherein k and l independently represent O, 1, or an integer greater than 1 and R* represents hydrogen or an alkyl group such as a methyl, ethyl, propyl, isopropyl, butyl, isobutyl or pentyl group. Preferably R* represent hydrogen or a methyl group and preferably k and l independently represent an integer equal to 1 to 20, more preferably an integer equal to 2 to 10 and most preferably an integer selected from 2, 3, 4, 5 or 6.

More preferably the linking group $L^1$ represents —$(CH_2)_k$— with k equal to 1, 2, 3, 4 or 5, —CO—NH—, >N—CO—NH— or —NR*—CO—NH— with R* equal to hydrogen, methyl, ethyl; or combinations thereof. Most preferably the linking group $L^1$ represents:

—CO—NH-aliphatic group-;

—NH—CO—NH-aliphatic group-;

—N(CH$_3$)—CO—NH-aliphatic group-; or

>N—CO—NH-aliphatic group-wherein the aliphatic group preferably represents methylene, ethylene, propylene or butylene.

Examples of the optional substituents on the alkyl, cycloalkyl, alkenyl, alkynyl, aryl or heteroaryl group include a halogen atom (e.g., F, Cl, Br or I), a hydroxy group or a cyano group.

Suitable examples of organosilicon compounds of the general Formula (II) are, without being limited thereto, given in the Table B below.

TABLE B

Suitable examples of organosilicon compounds of the general Formula (II)

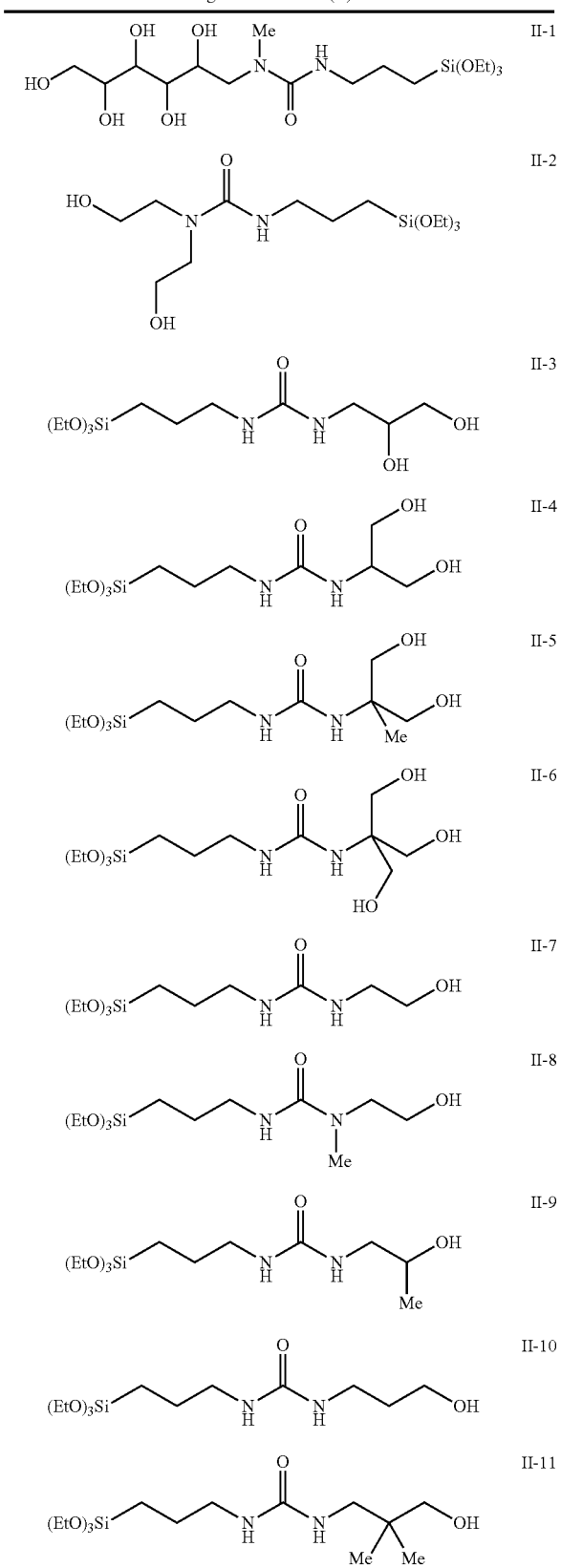

TABLE B-continued

Suitable examples of organosilicon compounds of the general Formula (II)

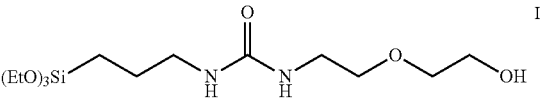

In a preferred embodiment, the polysiloxane further contains, besides the organosilicon compound of the general Formula's (I) and (II), a third organosilicon compound containing at least one phosphonic acid group or at least one phosphoric acid group. The organosilicon compound containing at least one phosphonic acid group is preferably represented by the general Formula (III):

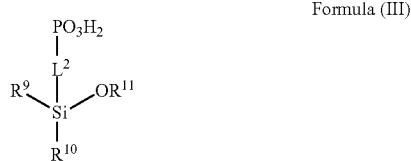

Formula (III)

wherein $R^9$ and $R^{10}$ independently represent an alkoxy, aryloxy or an acyloxy group, an optionally substituted alkyl, alkenyl, alkynyl, aryl or heteroaryl group;

$L^2$ represents a divalent linking group selected from an alkylene, a cycloalkylene, an arylene, a heteroarylene, a (poly)alkylene oxide group such as a (poly)ethylene oxide group, —O—(CH$_2$)$_k$—, —S—(CH$_2$)$_k$—, —(CH$_2$)$_k$—O—CO—(CH$_2$)$_l$—, —CS—(CH$_2$)$_k$—, —CO—(CH$_2$)$_k$—, —O—CO—NH—, —(CH$_2$)$_k$—CO—NH—, —NR'—CO—NH—, —NH—CS—NH—, or combinations thereof and wherein R' represents hydrogen or a methyl group, preferably R' represents hydrogen and k and l independently represent O, 1, or an integer greater than 1. Preferably k and l independently represent an integer selected from to 1 to 20, more preferably an integer selected from to 2 to 10, and most preferably an integer equal to 2, 3, 4, 5 or 6;

$R^{11}$ represents an optionally substituted alkyl, alkenyl, alkynyl, aryl, heteroaryl or acyl group.

Preferably $R^9$ and $R^{10}$ independently represent an alkoxy group such as a methoxy or ethoxy group; and $R^{11}$ represents an optionally substituted alkyl group such as a methyl, ethyl, propyl, isopropyl, butyl or pentyl group.

The optionally substituted acyl group represents for example an alkylcarbonyl group having 1 to 30 carbon atoms, an arylcarbonyl group having 7 to 30 carbon atoms, or a heterocyclic carbonyl group having 4 to 30 carbon atoms in which the heterocyclic group is connected to the carbonyl group with its carbon atom. Suitable examples include an acetyl, pivaloyl, 2-chloroacetyl, stearoyl, benzoyl or a 2-pyridylcarbonyl group.

Preferably the linking group $L^2$ represents an alkylene, a cycloalkylene, arylene or heteroarylene group or —NH—CO—NH— and combinations thereof. Most preferably, the linking group $L^2$ represents an alkylene represented by —(CH$_2$)$_m$—, a cycloalkylene such as divalent cyclopentyl or cyclohexyl, or —NH—CO—NH—, and combinations thereof, and wherein m represents 1, 2, 3, 4 or 5.

The linking group $L^2$ preferably does not contain a basic nitrogen atom such as a secondary or a tertiary amino group. Generally, a basic amino group has a pKa value from about 9 to about 12. Specifically polysiloxanes including organosilicon compounds according to Formula (III) containing a linking group including —NR$^e$—CHR$^f$—, —NR$^e$—CH< or >N—CH$_2$— with R$^e$ and R$^f$ independently selected from hydrogen, an alkyl, aryl or heteroaryl group, have a bad effect on the lithographic performance and/or result in an inferior image on the plate.

Examples of the optional substituents on the alkyl, cycloalkyl, alkenyl, alkynyl, acyl, aryl or heteroaryl group include a halogen atom (e.g., F, Cl, Br or I), a hydroxy group or a cyano group.

Suitable examples of organosilicon compounds of the general Formula (III) are, without being limited thereto, given in the Table C below.

TABLE C suitable examples of organosilicon compounds of the general Formula (III)

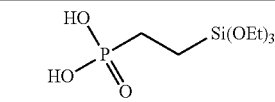
III-1

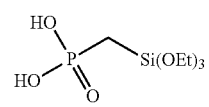
III-2

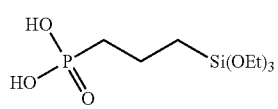
III-3

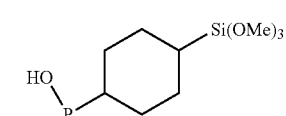
III-4

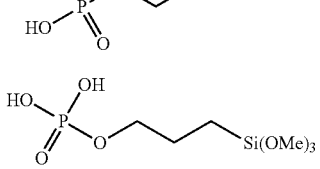
III-5

TABLE C-continued suitable examples of organosilicon compounds of the general Formula (III)

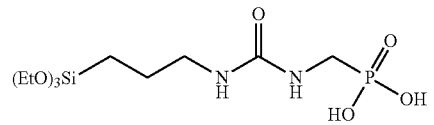
III-6

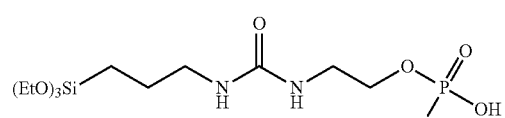
III-7

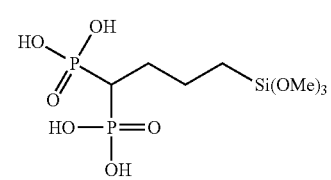
III-8

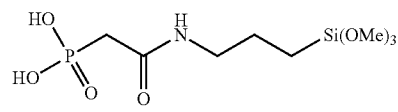
III-9

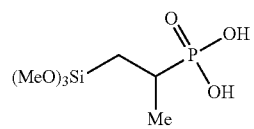
III-10

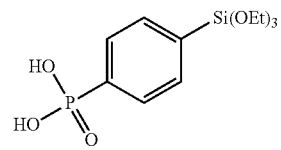
III-11

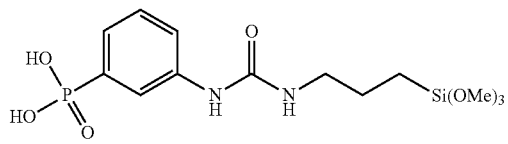
III-12

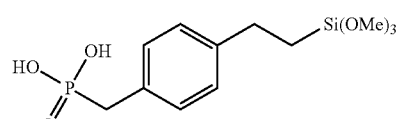
III-13

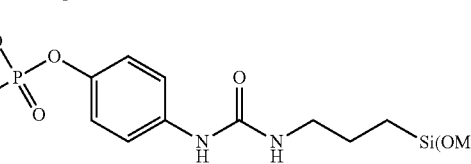
III-14

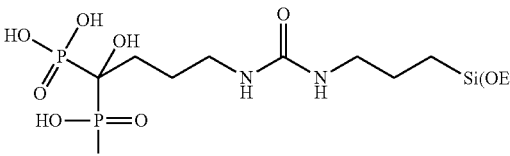
III-15

TABLE C-continued suitable examples of organosilicon compounds of the general Formula (III)

III-16

[Chemical structure: HO-P(=O)(OH)-CH(Me)-NH-C(=O)-CH2-S-CH2CH2CH2-Si(OMe)3]

III-17

[Chemical structure: HO-P(=O)(OH)-C(Me)(OH)-O-CH2CH2CH2-Si(OEt)3]

The polysiloxanes according to a preferred embodiment of the present invention have a branched or unbranched backbone including alternating silicon and oxygen atoms —Si—O—Si—O—. The polysiloxanes can be copolymers including units derived from the organosilicon compound according to Formula (I) and units derived from the organosilicon compound according to Formula (II), and optionally units derived from the organosilicon compound according to Formula (III). They can be random copolymers, alternating copolymers or block copolymers. The term "copolymer" refers to polymers that include two or more different units derived from the organosilicon compounds and the term "polymer" refers to high and low molecular weight polymers including oligomers. A weight average molecular weight (Mw) of the specific polysiloxane can be appropriately set according to the targeted performance design of the lithographic printing plate precursor. The weight average molecular weight is preferably from 2,000 to 1,000,000, more preferably from 2,000 to 500,000, and most preferably from 10,000 to 500,000.

The preparation of the polysiloxanes according to a preferred embodiment of the present invention by reacting organosilicon compounds of Formula (I) and Formula (II) and optionally organosilicon compounds of Formula (III), has, compared to for example addition polymerisations where molecules incorporating double or triple chemical bonds are linked together to form the repeating chain, the major advantage that the obtained reaction products can be immediately used in for example a coating of a printing plate without the need for purification.

The polysiloxane may be obtained by reacting the organosilicon compound of Formula (I) in an amount ranging between 10 to 50 mol % with the organosilicon compound of Formula (II) in an amount ranging between 20 to 90 mol %; and optionally by further reacting with the organosilicon compound of Formula (III) in an amount ranging between 20 to 90 mol %.

The lithographic printing plate precursor according to a preferred embodiment of the present invention is negative-working, i.e. after exposure and development the non-exposed areas of the coating are removed from the support and define hydrophilic (non-printing) areas, whereas the exposed coating is not removed from the support and defines oleophilic (printing) areas. The hydrophilic areas are defined by the support which has a hydrophilic surface or is provided with a hydrophilic layer. The hydrophobic areas are defined by the coating, hardened upon exposing, optionally followed by a heating step. Areas having hydrophilic properties means areas having a higher affinity for an aqueous solution than for an oleophilic ink; areas having hydrophobic properties means areas having a higher affinity for an oleophilic ink than for an aqueous solution.

"Hardened" means that the coating becomes insoluble or non-dispersible for the developing solution and may be achieved through polymerization and/or crosslinking of the photosensitive coating, optionally followed by a heating step to enhance or to speed-up the polymerization and/or crosslinking reaction. In this optionally heating step, hereinafter also referred to as "pre-heat", the plate precursor is heated, preferably at a temperature of about 80° C. to 150° C. and preferably during a dwell time of about 5 seconds to 1 minute.

The coating has at least one layer including a photopolymerizable composition, said layer hereinafter also referred to as "photopolymerizable layer". The coating may include an intermediate layer, located between the support and the photopolymerisable layer. The polysiloxane is most preferably present in the photopolymerizable layer. The amount of polysiloxane in the photopolymerizable layer is preferably above 1% wt, more preferably above 2% wt and most preferably above 5% wt relative to the total weight of all ingredients in the photopolymerizable layer. Alternatively, the polysiloxane in the photopolymerizable layer is preferably between 1 and 40% wt, more preferably between 2% wt and 20% wt and most preferably between 5 and 15% wt.

The level of the polysiloxane in the coating of the printing plate preferably ranges between $0.01$ g/m$^2$ to $1$ g/m$^2$, more preferably between $0.02$ g/m$^2$ to $0.5$ g/m$^2$ and most preferably between $0.02$ g/m$^2$ to $0.2$ g/m$^2$. The thickness of the coating preferably ranges between $0.4$ and $10$ g/m$^2$, more preferably between $0.5$ and $5$ g/m$^2$, most preferably between $0.6$ and $3$ g/m$^2$.

Alternatively, the polysiloxane may be present in the intermediate layer in an amount of at least 10 wt %, preferably at least 15 wt %, more preferably at least 50 wt %, even more preferably at least 90 wt %, most preferably 100 wt % of the non-volatile components of the composition. The optionally intermediate layer has a coating thickness preferably ranging between $0.001$ and $1.5$ g/m$^2$, more preferably between $0.003$ and $1.0$ g/m$^2$, most preferably between $0.005$ and $0.7$ g/m$^2$. The polysiloxane may also be present in both the photopolymerisable layer and the intermediate layer.

The photopolymerizable layer includes, besides the polysiloxane, a polymerizable compound, optionally a binder, a polymerization initiator capable of hardening said polymerizable compound in the exposed areas, and optionally a sensitizer capable of absorbing light used in the image-wise exposing step. The photopolymerizable layer has a coating thickness preferably ranging between $0.4$ and $5.0$ g/m$^2$, more preferably between $0.5$ and $3.0$ g/m$^2$, most preferably between $0.6$ and $2.2$ g/m$^2$.

According to one preferred embodiment of the present invention, the polymerizable compound is a monomer or oligomer including at least one epoxy or vinyl ether functional group and the polymerisation initiator is a Brönsted acid generator capable of generating free acid, optionally in the presence of a sensitizer, upon exposure, hereinafter the Brönsted acid generator is also referred to as "cationic photoinitiator" or "cationic initiator".

Suitable polyfunctional epoxy monomers include, for example, 3,4-epoxycyclohexylmethyl-3,4-epoxycyclohexane carboxylate, bis-(3,4-epoxycyclohexymethyl) adipate, difunctional bisphenol Aepichlorohydrin epoxy resin and multifunctional epichlorohydrinitetraphenylol ethane epoxy resin.

Suitable cationic photoinitiators include, for example, triarylsulfonium hexafluoroantimonate, triarylsulfonium hexafluorophosphate, diaryliodonium hexafluoroantimonate, and haloalkyl substituted s-triazine. It is noted that most cationic initiators are also free radical initiators because, in addition to generating Brönsted acid, they also generate free radicals during photo or thermal decomposition.

According to a more preferred embodiment of the present invention, the polymerizable compound is a polymerizable monomer or oligomer including at least one terminal ethylenic group, hereinafter also referred to as "free-radical polymerizable monomer", and the polymerisation initiator is a compound capable of generating free radicals upon exposure, optionally in the presence of a sensitizer, hereinafter said initiator is referred to as "free radical initiator". The polymerization involves the linking together of the free-radical polymerizable monomers.

Suitable free-radical polymerizable monomers include, for example, multifunctional (meth)acrylate monomers (such as (meth)acrylate esters of ethylene glycol, trimethylolpropane, pentaerythritol, ethoxylated ethylene glycol and ethoxylated trimethylolpropane, multifunctional urethanated (meth)acrylate, and epoxylated (meth)acrylate), and oligomeric amine diacrylates. The (meth)acrylic monomers may also have other double bond or epoxide group, in addition to (meth) acrylate group. The (meth)acrylate monomers may also contain an acidic (such as carboxylic acid) or basic (such as amine) functionality.

Any free radical initiator capable of generating free radicals upon exposure directly or in the presence of a sensitizer, is a suitable initiator. Suitable free-radical initiators are described in WO 2005/111727 from page 15 line 17 to page 16 line 11.

In a preferred embodiment of the present invention the photopolymerizable composition comprises a hexaaryl-bisimidazole compound (HABI; dimer of triaryl-imidazole) as polymerization initiator, optionally in combination with further polymerization initiators.

A procedure for the preparation of hexaarylbisimidazoles is described in DE 1470 154 and their use in photopolymerizable compositions is documented in EP 24 629, EP 107 792, U.S. Pat. No. 4,410,621; EP 215 453 and DE 3 211 312. Preferred derivatives are e.g. 2,4,5,2',4',5'-hexaphenylbisimidazole, 2,2'-bis(2-chlorophenyl)-4,5,4',5'-tetraphenylbisimidazole, 2,2'-bis(2-chlorophenyl)-4,5,4',5'-tetrakis(3-methoxyphenyl)bisimidazole and 2,2'-bis(2-nitrophenyl)-4,5,4',5'-tetraphenylbisimidazole. The amount of the HABI polymerization initiator typically ranges from 0.01 to 30% by weight, preferably from 0.5 to 20% by weight, relative to the total weight of the non volatile components of the photopolymerizable composition.

A very high sensitivity can be obtained in the context of the present invention by the combination of an optical brightener as sensitizer and a hexaarylbisimidazole compound as polymerization initiator.

Suitable classes of polymerization initiators other than hexaarylbisimidazole compounds include aromatic ketones, aromatic onium salts, organic peroxides, thio compounds, ketooxime ester compounds, borate compounds, azinium compounds, metallocene compounds, active ester compounds and compounds having a carbon-halogen bond, but preferably the composition comprises a non-boron comprising polymerization initiator and particularly preferred the polymerization initiator comprises no boron compound. Many specific examples of initiators suitable for the present invention can be found in EP-A 1 091 247. Other preferred polymerization initiators are trihalo methyl sulphones.

Preferably hexaarylbisimidazole compounds and/or metallocene compounds are used alone or in combination with other suitable photoinitiators, in particular with aromatic ketones, aromatic onium salts, organic peroxides, thio compounds, ketoxime ester compounds, azinium compounds, active ester compounds or compounds having a carbon halogen bond.

In a preferred embodiment of the present invention the hexaarylbisimidazole compounds make more than 50 mol %, preferably at least 80 mol % and particularly preferred at least 90 mol % of all the photoinitiators used in the photopolymerizable composition of the present invention.

According to another preferred embodiment of the present invention, the polymerizable monomer or oligomer may be a combination of a monomer or oligomer comprising at least one epoxy or vinyl ether functional group and a polymerizable ethylenically unsaturated compound having at least one terminal ethylenic group, and the polymerisation initiator may be a combination of a cationic initiator and a free-radical initiator. A monomer or oligomer comprising at least one epoxy or vinyl ether functional group and a polymerizable ethylenically unsaturated compound having at least one terminal ethylenic group, can be the same compound wherein the compound contains both the ethylenic group and the epoxy or vinyl ether group. Examples of such compounds include epoxy functional acrylic monomers, such as glycidyl acrylate. The free radical initiator and the cationic initiator can be the same compound if the compound is capable of generating both free radical and free acid. Examples of such compounds include various onium salts such as diaryliodonium hexafluoroantimonate and s-triazines such as 2,4-bis (trichloromethyl)-6-[(4-ethoxyethylenoxy)-phen-1-yl]-s-triazine which are capable of generating both free radical and free acid, preferably in the presence of a sensitizer.

The photopolymerizable layer may also comprise a multifunctional monomer. This monomer contains at least two functional groups selected from an ethylenically unsaturated group and/or an epoxy or vinyl ether group. Particular multifunctional monomers for use in the photopolymer coating are disclosed in U.S. Pat. No. 6,410,205, U.S. Pat. No. 5,049, 479, EP 1 079 276, EP 1 369 232, EP 1 369 231, EP 1 341 040, US 2003/0124460, EP 1 241 002, EP 1 288 720 and in the reference book including the cited references: Chemistry & Technology UV & EB formulation for coatings, inks & paints—Volume 2—Prepolymers and Reactive Diluents for UV and EB Curable Formulations by N. S. Allen, M. A. Johnson, P. K. T. Oldring, M. S. Salim—Edited by P. K. T. Oldring—1991—ISBN 0 947798102. Particularly preferred are urethane (meth)acrylate multifunctional monomers, which can be used alone or in combination with other (meth) acrylate multifunctional monomers.

The photopolymerizable layer may also comprise a co-initiator. Typically, a co-initiator is used in combination with a free radical initiator and/or a cationic initiator. Suitable co-initiators for use in the photopolymer coating are disclosed in U.S. Pat. No. 6,410,205; U.S. Pat. No. 5,049,479; EP 1 079 276, EP 1 369 232, EP 1 369 231, EP 1 341 040, US 2003/0124460, EP 1 241 002, EP 1 288 720 and in the reference book including the cited references: Chemistry & Technology UV & EB formulation for coatings, inks & paints—Volume 3—Photoinitiators for Free Radical and Cationic Polymerisation by K. K. Dietliker—Edited by P. K. T. Oldring—1991—ISBN 0 947798161.

The photopolymerizable layer may also comprise an inhibitor. Particular inhibitors for use in the photopolymer coating are disclosed in U.S. Pat. No. 6,410,205, EP 1 288 720 and EP 1 749 240. The photopolymerizable layer may further comprise an adhesion promoting compound. More information on suitable adhesion promoting compounds are described in EP 1 788 434 in [0010].

Besides the polysiloxane, the photopolymerizable layer may include a binder. The binder can be selected from a wide series of organic polymers. Compositions of different binders can also be used. Useful binders are described in WO2005/052298 page 17 line 21 to page 19 line 30, in EP 152 819 on page 2 line 50 to page 4 line 20, and in EP 1 043 627 in paragraph [0013].

The organic polymers used as binders have a typical mean molecular weight $M_w$ between 1000 and 700 000, preferably between 1500 and 350 000. Preferably, the binders have a hydroxyl number between 0 and 750, more preferably between 10 and 500. Even more preferably the hydroxyl number is below 10, most preferably the hydroxyl number is 0. The amount of binder(s) generally ranges from 1 to 60% by weight, preferably 5 to 50% by weight, more preferably 10 to 35% by weight and most preferably 15 to 25% by weight relative to the total weight of the non-volatile components of the composition.

In another preferred embodiment the polymeric binder comprises a backbone including pendant groups such as for example a hydrophilic poly(alkylene oxide) segment. The polymeric binder may also include pendant cyano groups attached to the backbone. A combination of such binders may also be employed. Generally the polymeric binder is solid at room temperature, and is typically a non-elastomeric thermoplastic. Generally the polymeric binder is characterized by a number average molecular weight (Mn) in the range from about 500 to 250000, more commonly in the range from about 1000 to 240000 or 1500 to 200000. The polymerizable composition may comprise discrete particles of the polymeric binder. Preferably the discrete particles are particles of the polymeric binder which are suspended in the polymerizable composition. The presence of discrete particles tends to promote developability of the unexposed areas. Specific examples of the polymeric binders according to this preferred embodiment are described in U.S. Pat. No. 6,899,994; US 2004/0260050, US 2005/0003285, US 2005/0170286 and US 2005/0123853. In addition to the polymeric binder of this preferred embodiment the imageable layer may optionally comprise one or more co-binders. Typical co-binders are water-soluble or water-dispersible polymers, such as, cellulose derivatives, polyvinylalcohol, polyacrylic acid poly(meth)acrylic acid, polyvinylpyrrolidone, polylactide, polyvinylphosphonic acid, synthetic co-polymers, such as the copolymer of an alkoxy polyethylene glycol (meth)acrylate. Specific examples of co-binders are described in US 2004/0260050, US 2005/0003285 and US 2005/0123853. Printing plate precursors, the imageable layer of which comprises a binder and optionally a co-binder according this preferred embodiment and described in more detail in US 2004/0260050, US 2005/0003285 and US 2005/0123853, optionally comprise a topcoat and an interlayer.

Various surfactants may be added into the photopolymerizable layer to allow or enhance the developability of the precursor; especially developing with a gum solution. Both polymeric and small molecule surfactants can be used. Non-ionic surfactants are preferred. Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added in an amount ranging between 0.1 and 30% by weight of the coating, more preferably between 0.5 and 20% by weight of the coating, and most preferably between 1 and 15% by weight of the coating or between 2 and 8% by weight of the coating.

Suitable examples of optical brighteners as sensitizers are described in WO 2005/109103 page 24, line 20 to page 39. The photocurable composition may also comprise other sensitizers. Highly preferred sensitizers are violet light absorbing sensitizers, having an absorption spectrum between 350 nm and 450 nm, preferably between 370 nm and 420 nm, more preferably between 390 nm and 415 nm. Particular preferred sensitizers are disclosed in EP 1 349 006 paragraph [0007] to [0009], EP 1 668 417 and WO 2004/047930, including the cited references in these patent applications. Other highly preferred sensitizers are infrared light absorbing dyes, having an absorption spectrum between 750 nm and 1300 nm, preferably between 780 nm and 1200 nm, more preferably between 800 nm and 1100 nm. Particular preferred sensitizers are heptamethinecyane dyes, especially the dyes disclosed in EP 1 359 008 paragraph [0030] to [0032]. Other preferred sensitizers are blue, green or red light absorbing sensitizers, having an absorption spectrum between 450 nm and 750 nm. Useful sensitizers can be selected from the sensitizing dyes disclosed in U.S. Pat. No. 6,410,205; U.S. Pat. No. 5,049,479; EP 1 079 276, EP 1 369 232, EP 1 369 231, EP 1 341 040, US 2003/0124460, EP 1 241 002 and EP 1 288 720.

The photopolymerizable layer or an optional other layer of the coating may also comprise a colorant. After processing, at least part of the colorant remains on the hardened coating areas, and a visible image can be produced on the support by removing the coating, including the colorant, at the non-exposed. The colorant can be a dye or a pigment. Various types of pigments can be used such as organic pigments, inorganic pigments, carbon black, metallic powder pigments and fluorescent pigments. Organic pigments are preferred.

Specific examples of organic pigments include quinacridone pigments, quinacridonequinone pigments, dioxazine pigments, phthalocyanine pigments, anthrapyrimidine pigments, anthanthrone pigments, indanthrone pigments, flavanthrone pigments, perylene pigments, diketopyrrolopyrrole pigments, perinone pigments, quinophthalone pigments, anthraquinone pigments, thioindigo pigments, benzimidazolone pigments, isoindolinone pigments, azomethine pigments, and azo pigments.

Specific examples and more detailed information of pigments suitable as colorant in the current invention are described in EP 2 278 404 in paragraphs [0064] to [0068].

Typically, the amount of pigment in the coating may be in the range of about 0.005 $g/m^2$ to 2 $g/m^2$, preferably about 0.007 $g/m^2$ to 0.5 $g/m^2$, more preferably about 0.01 $g/m^2$ to 0.2 $g/m^2$, most preferably about 0.01 $g/m^2$ to 0.1 $g/m^2$.

The colorant can also be a dye. Any known dyes, such as commercially available dyes or dyes described in, for example, "Dye Handbook" (edited by the Organic Synthetic Chemistry Association, published in 1970) which are colored for the human eye, can be used as colorant in the photopolymerizable coating. Specific examples thereof are described in EP 2 278 404 in paragraph [0070].

Typically, the amount of dye in the coating may be in the range of about 0.005 $g/m^2$ to 2 $g/m^2$, preferably about 0.007 $g/m^2$ to 0.5 $g/m^2$, more preferably about 0.01 $g/m^2$ to 0.2 $g/m^2$, most preferably about 0.01 $g/m^2$ to 0.1 $g/m^2$.

The photopolymerizable layer or an optional other layer of the coating may include a printing-out agent, i.e. a compound which is capable of changing the color of the coating upon exposure. After image-wise exposing of the precursor, a visible image can be produced, hereinafter also referred to as "print-out image". The printing-out agent may be a compound as described in EP-A-1 491 356 paragraph [0116] to [0119] on page 19 and 20, and in US 2005/8971 paragraph [0168] to [0172] on page 17. Preferred printing-out agents are the compounds described in EP 1 765 592 from line 1 page 9 to line 27 page 20. More preferred are the IR-dyes as described in EP 1 736 312 from line 32 page 5 to line 9 page 32. The contrast of the image formed after image-wise exposure and processing is defined as the difference between the optical density at the exposed area to the optical density at the non-exposed area, and this contrast is preferably as high as possible. This enables the end-user to establish immediately whether or not the precursor has already been exposed and processed, to distinguish the different color selections and to inspect the quality of the image on the treated plate precursor. The contrast increases with increasing optical density in the exposed area and/or decreasing optical density in the non-exposed areas. The optical density in the exposed area may increase with the amount and extinction coefficient of the colorant remaining in the exposed areas and the intensity of color formed by the printing-out agent. In the non-exposed areas it is preferred that the amount of colorant is as low as possible and that the intensity of color print-out agent is as low as possible. The optical density can be measured in reflectance using an optical densitometer, equipped with several filters (e.g. cyan, magenta, yellow). The difference in optical density at the exposed area and the non-exposed area has preferably a value of at least 0.3, more preferably at least 0.4, most preferably at least 0.5. There is no specific upper limit for the contrast value, but typically the contrast is not higher than 3.0 or even not higher than 2.0. In order to obtain a good visual contrast for a human observer the type of color of the colorant may also be important. Preferred colors for the colorant are cyan or blue colors, i.e. under blue color we understand a color that appears blue for the human eye.

The coating may include on the photopolymerizable layer a top layer which acts as an oxygen barrier layer including water-soluble or water-swellable binders. Preferred binders which can be used in the top layer are polyvinyl alcohol and the polymers disclosed in WO2005/029190, U.S. Pat. No. 6,410,205 and EP 1 288 720, including the cited references in these patents and patent applications. The most preferred binder for the top layer is polyvinylalcohol. The polyvinylalcohol has preferably a hydrolysis degree ranging between 74 mol % and 99 mol %. The weight average molecular weight of the polyvinylalcohol can be measured by the viscosity of an aqueous solution, 4% by weight, at 20° C. as defined in DIN 53 015, and this viscosity number ranges preferably between 3 and 26, more preferably between 3 and 15, most preferably between 3 and 10.

The coating thickness of the top layer is preferably between 0.25 and 1.75 g/m$^2$, more preferably between 0.25 and 1.3 g/m$^2$, most preferably between 0.25 and 1.0 g/m$^2$. In a more preferred embodiment of the present invention, the top layer has a coating thickness between 0.25 and 1.75 g/m$^2$ and comprises a polyvinylalcohol having a hydrolysis degree ranging between 74 mol % and 99 mol % and a viscosity number as defined above ranging between 3 and 26.

In a preferred embodiment, the composition and the thickness of the top layer are optimised in order to obtain a high sensitivity, a good daylight stability and less or no sludge formation during processing. In order to reduce sludge, the top layer comprises less polyvinylalcohol and polyvinylalcohol with a lower molecular weight, preferably a viscosity number of less than 26, more preferably less than 10 is used and a thickness as low as possible but more than 0.25 g/m$^2$. In order to improve the sensitivity, a good oxygen barrier is desired, using a polyvinylalcohol with a high hydrolysis degree, preferably 88-980, and a bigger thickness or the top layer. In order to improve the daylight stability, small penetration of oxygen is desired by a using an oxygen barrier with reduced barrier property for oxygen, preferably by using a smaller thickness of the top layer and with polyvinylalcohol having a lower hydrolysis degree. Due to a good balance of these elements, an optimised property for the precursor can be obtained.

The support is preferably a grained and anodized aluminium support, well known in the art. Suitable supports are for example disclosed in EP 1 843 203 (paragraphs [0066] to [0075]). The grained and anodized aluminium support may be subjected to so-called post-anodic treatments, for example a treatment with polyvinylphosphonic acid or derivatives thereof, a treatment with polyacrylic acid, a treatment with potassium fluorozirconate or a phosphate, a treatment with an alkali metal silicate, or combinations thereof. However, for a precursor optimized to be used without a pre-heat step it is preferred to use a grained and anodized aluminium support without any post-anodic treatment. Besides an aluminium support, a plastic support, for example a polyester support, provided with one or more hydrophilic layers as disclosed in for example EP 1 025 992 may also be used.

According to a preferred embodiment of the present invention there is also provided a method for making a negative-working lithographic printing plate comprising the steps of imagewise exposing the printing plate precursor followed by developing the imagewise exposed precursor so that the non exposed areas are dissolved in the developer solution. Optionally, after the imaging step, a heating step is carried out to enhance or to speed-up the polymerization and/or crosslinking reaction.

The image-wise exposing step can be carried out by a laser. Preferably, the image-wise exposing step is carried out off-press in a plate setter, i.e. an exposure apparatus suitable for image-wise exposing the precursor by a laser such as a laser diode, emitting around 830 nm, a Nd YAG laser, emitting around 1060 nm, a violet laser, emitting around 400 nm, or a gas laser such as Ar laser, or by a digital modulated UV-exposure, e.g. by means of digital mirror devices, or by a conventional exposure in contact with a mask. In a preferred embodiment of the present invention, the precursor is image-wise exposed by a laser emitting IR-light or violet light.

During the optional heating step the plate precursor is heated, preferably at a temperature of about 80° C. to 150° C. and preferably during a dwell time of about 5 seconds to 1 minute. The preheating step is preferably carried out in a preheating unit which is preferably provided with heating elements such as IR-lamps, UV-lamps, heated air, a heated metal roll, etc.

After the exposing step or, when a preheating step is present, after the preheating step, the precursor may be washed in a prewashing station, whereby at least part of the top layer can be removed by supplying a wash liquid, i.e. water or an aqueous solution, to the coating of the precursor. The washing liquid is preferably water, more preferably tap water. More details concerning the wash step are described in EP 1 788 434 in [0026].

After the exposure step, the optional heating step and the optional prewashing step, the precursor is preferably developed by immersing the precursor in a developing solution. The developing step is preferably carried out off-press with an aqueous alkaline developing solution or a gum solution. During the development step, the non-exposed areas of the image-recording layer are at least partially removed without essentially removing the exposed areas. The processing liquid can be applied to the plate e.g. by rubbing with an impregnated pad, by dipping, immersing, (spin-) coating, spraying, pouring-on, either by hand or in an automatic processing apparatus. The treatment with a processing liquid may be combined with mechanical rubbing, e.g. by a rotating brush. The developed plate precursor can, if required, be post-treated with rinse water, a suitable correcting agent or preservative as known in the art. During the development step, any water-soluble protective layer present is preferably also removed. The development is preferably carried out at temperatures of 20° C. to 40° C. in automated processing units as customary in the art. More details concerning the development step can be found in for example EP 1 614 539 in [42] to [43]. Development in a gumming station comprising at least one gumming unit is for example described in WO 2007057348 on page 40 line 34 to page 44 line 14.

The development step with an aqueous alkaline developing solution may be followed by a rinsing step and/or a gumming step.

Alternatively, the development step can be carried out by applying a gum solution thereby removing the non-exposed areas of the photopolymerizable layer from the support and gumming the plate in a single step. Preferably, the gumming unit is mechanically coupled to the platesetter by conveyor wherein the precursor is shielded from ambient light. A gum solution is typically an aqueous liquid which comprises one or more surface protective compounds that are capable of protecting the lithographic image of a printing plate against contamination, e.g. by oxidation, fingerprints, fats, oils or dust, or damaging, e.g. by scratches during handling of the plate. Suitable examples of such compounds are film-forming hydrophilic polymers or surfactants. The layer that remains on the plate after treatment with the gum solution preferably comprises between 0.005 and 20 g/m of the surface protective compound, more preferably between 0.010 and 10 g/m, most preferably between 0.020 and 5 g/m. More details concerning the surface protective compounds in the gum solution can be found in WO 2007/057348 page 9 line 3 to page 11 line 6.

The gum solution preferably has a pH value between 3 and 11, more preferably between 4 and 10.5, even more preferably between 4.5 and 9, and most preferably between 5 and 7. A suitable gum solution is described in for example EP 1 342 568 in [0008] to [0022]. The viscosity of the gum solution can be adjusted to a value of e.g. between 1.7 and 5 mPa·s, by adding viscosity increasing compounds, such as poly(ethylene oxide) or polyvinylalcohol, e.g. having a molecular weight between $10^4$ and $10^7$. Such compounds can be present in a concentration of 0.01 to 10 g/l.

The gum solution may further comprise an inorganic salt, an anionic surfactant, a wetting agent, a chelate compound, an antiseptic compound, an anti-foaming compound and/or an ink receptivity agent and/or combinations thereof. More details about these additional ingredients are described in WO 2007/057348 page 11 line 22 to page 14 line 19.

Alternatively, the development step can be carried out on press by mounting the exposed precursor on a plate cylinder of a lithographic printing press and rotating the plate cylinder while feeding dampening liquid and/or ink to the coating.

After the processing step the plate may be dried in a drying unit. In a preferred embodiment the plate is dried by heating the plate in the drying unit which may contain at least one heating element selected from an IR-lamp, an UV-lamp, a heated metal roller or heated air. In a preferred embodiment of the present invention, the plate is dried with heated air as known in the drying section of a classical developing machine.

After drying the plate, the plate can optionally be heated in a baking unit. More details concerning the heating in a baking unit can be found in WO 2007/057348 page 44 line 26 to page 45 line 20.

The printing plate thus obtained can be used for conventional, so-called wet offset printing, in which ink and an aqueous dampening liquid is supplied to the plate. Another suitable printing method uses a so-called single-fluid ink without a dampening liquid. Suitable single-fluid inks have been described in U.S. Pat. No. 4,045,232; U.S. Pat. No. 4,981,517 and U.S. Pat. No. 6,140,392. In a most preferred embodiment, the single-fluid ink comprises an ink phase, also called the hydrophobic or oleophilic phase, and a polyol phase as described in WO 00/32705.

EXAMPLES

I. Synthesis of the Polysiloxanes

1. Synthesis of the Organosilicon Compounds According to Formula (I):

Reaction Scheme:

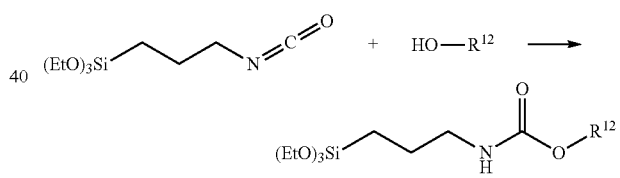

General Procedure:

The alcohol as specified in Table 1 below was added to (3-isocyanatopropyl)-triethoxysilane. Subsequently, dibutyltin dilaurate (DBTDL) was added and the reaction was allowed to continue for the specified time at room temperature. TLC chromatography was used to determine the full conversion of the alcohol.

TABLE 1

| organosilicon compounds according to Formula (I) | | | | | |
|---|---|---|---|---|---|
| (EtO)₃Si~~~N=C=O | | | | | |
| | g (mol)* | HO—OR¹² | g (mol) | DBTDL ml | Reaction time hours |
| I-29 with n = 1 | 9.5 (0.0385) | HO~O~(C=O)~C(=CH₂)CH₃ | 5 (0.0385) | 0.05 | 20 |

TABLE 1-continued organosilicon compounds according to Formula (I)

(EtO)₃Si~~~N=C=O

| | g (mol)* | HO—OR¹² | g (mol) | DBTDL ml | Reaction time hours |
|---|---|---|---|---|---|
| I-29 with n = 5 | 4.04 (0.0163) | HO-[CH₂CH₂O]₅-C(O)-C(CH₃)=CH₂ ** | 5 (0.0163) | 0.05 | 68 |
| I-29 with n = 10 | 2.35 (0.0095) | HO-[CH₂CH₂O]₁₀-C(O)-C(CH₃)=CH₂ ** | 5 (0.0095) | 0.05 | 68 |
| I-31 | 4.61 (0.0202) | glycerol dimethacrylate | 5 (0.0202) | 0.15 | 20 |
| I-22 | 4.15 (0.0168) | pentaerythritol triacrylate ** | 5 (0.0168) | 0.15 | 20 |

*95% purity
** purified by preparative column chromatography before use

2. Synthesis of the Organosilicon Compounds According to Formula (II):

Reaction Scheme:

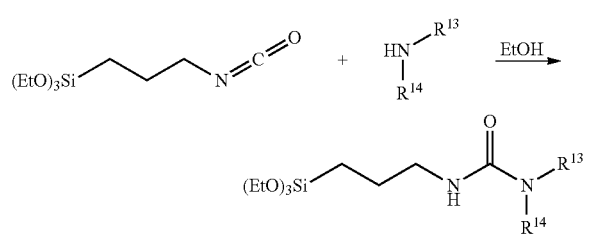

General Procedure:

(3-isocyanatopropyl)-triethoxysilane was dissolved in ethanol. The amine, as specified in Table 2 below was added and the reaction was allowed to continue for the specified time at the specified temperature. TLC chromatography in combination with ninhydrin detection was used to determine the full conversion of the amine.

The obtained ethanol solutions containing the different organosilicon monomers according to general Formula (II) were further used in the siloxane polymerization without isolating the urea-triethoxysilanes.

TABLE 2 organosilicon compounds according to Formula (II)

| | (EtO)$_3$Si–(CH$_2$)$_3$–N=C=O<br>g (mol)** | HN(R$^{13}$)(R$^{14}$) | g (mol) | EtOH ml | Reaction time hours | Reaction temp. °C. |
|---|---|---|---|---|---|---|
| II-1 | 2.8 (0.011) | 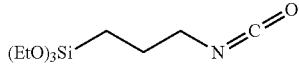 | 2.1 (0.011) | 5 | 16 | reflux |
| II-2 | 5 (0.019) |  | 2.2 (0.02) | 5 | 16 | 65 |
| II-3 | 5 (0.019) | 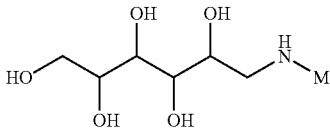 | 1.79 (0.02) | 5 | 1 | RT* |
| II-4 | 23.6 (0.091) | 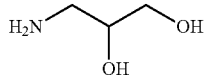 | 8.3 (0.091) | 25 | 16 | RT* |
| II-5 | 5 (0.019) | 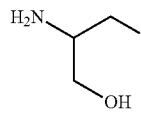 | 2 (0.019) | 5 | 2 | RT* |
| II-6 | 5 (0.019) | 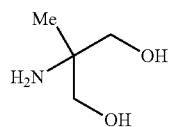 | 2.3 (0.019) | 5 | 4 | 70 °C.*** |
| II-7 | 5 (0.019) | 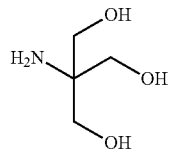 | 1.22 (0.02) | 5 | 2 | RT* |
| II-8 | 5 (0.019) | 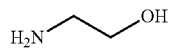 | 1.4 (0.019) | 5 | 2 | RT* |
| II-9 | 5 (0.019) | 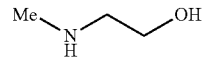 | 1.4 (0.019) | 5 | 2 | RT* |
| II-10 | 5 (0.019) | 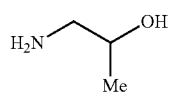 | 1.4 (0.019) | 5 | 2 | RT* |
| II-11 | 5 (0.019) | 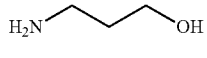 | 2 (0.019) | 5 | 16 | RT* |
| II-12 | 5 (0.019) | 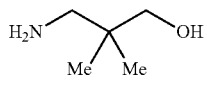 | 2 (0.019) | 5 | 2 | RT* |

*Room Temperature
**95% purity
***not completely dissolved when stored at room temperature, heating to 70° C. is necessary to use the solution in the synthesis of the polysiloxane.

3. Synthesis of the Organosilicon Compound According to Formula (III): [2-(triethoxysilyl)ethyl]-phosphonic Acid (Compound III-1):
Reaction Scheme:

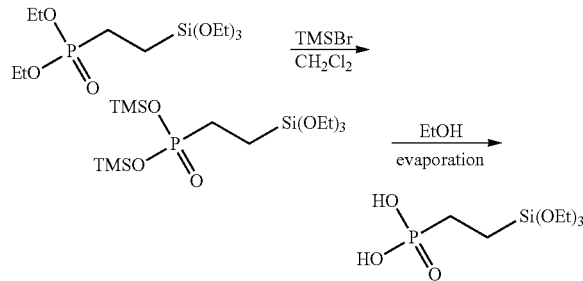

General Procedure:
34.8 g (0.106 mol) [2-(triethoxysilyl)ethyl]-phosphonic acid diethyl ester (commercially available from ABCR GmbH & Co.KG) was dissolved in 298 ml methylene chloride. 15.5 ml (18.0 g, 2.5 mol) trimethylsilyl bromide (TMSBr) was added and the reaction was allowed to continue for 90 minutes at room temperature. 85 ml ethanol was added and the reaction mixture was stirred for 30 minutes at room temperature. The reaction mixture was evaporated under reduced pressure and the residue was dried under vacuum until constant weight. The obtained [2-(triethoxysilyl)ethyl]-phosphonic acid (compound III-1) was used directly in the siloxane polymerization without further purification.

4. Synthesis of the Polysiloxanes by Reacting the Organosilicon Compounds of Formula (I) and Formula (II):
General Procedure:
(3-methacryloxypropyl)-trimethoxysilane (Compound I-1, commercially available) and Compound II-1 (see Table 2) were dissolved in water. The reagentia given in Table 3 below were added and the reaction was allowed to continue at room temperature for 24 hours. The aqueous solutions of the polymers were used as such in the printing plate coating solutions.

TABLE 3 polysiloxanes including the organosilicon compounds according to Formula (I) and Formula (II)

| Formula (I): compound I-1 g (mmol) | Formula (II): compound II-1 g (mmol) | MeSO$_3$H g (mmol) | MePO(OH)$_2$ g (mmol) | Water ml |
|---|---|---|---|---|
| Silox-01 | 0.6 (2.4) | 5 (11.2) | — | 0.2 (2.4) | 15 |
| Silox-02 | 0.4 (1.75) | 5.4 (12.3) | — | 0.3 (3.5) | 21 |
| Silox-03 | 0.6 (2.4) | 5 (11.2) | 0.2 (2.4) | — | 15 |
| Silox-04 | 0.4 (1.75) | 5.4 (12.3) | 0.3 (3.5) | — | 21 |

5. Synthesis of the Polysiloxanes Silox-05 to Silox-28 by Reacting the Organosilicon Compounds of Formula (I), Formula (II) and Formula (III):
Reaction Scheme (Example):

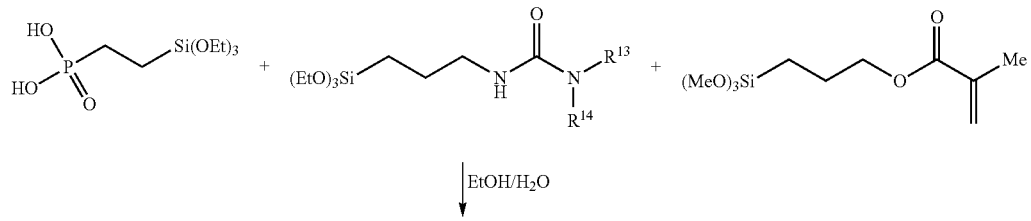

-continued

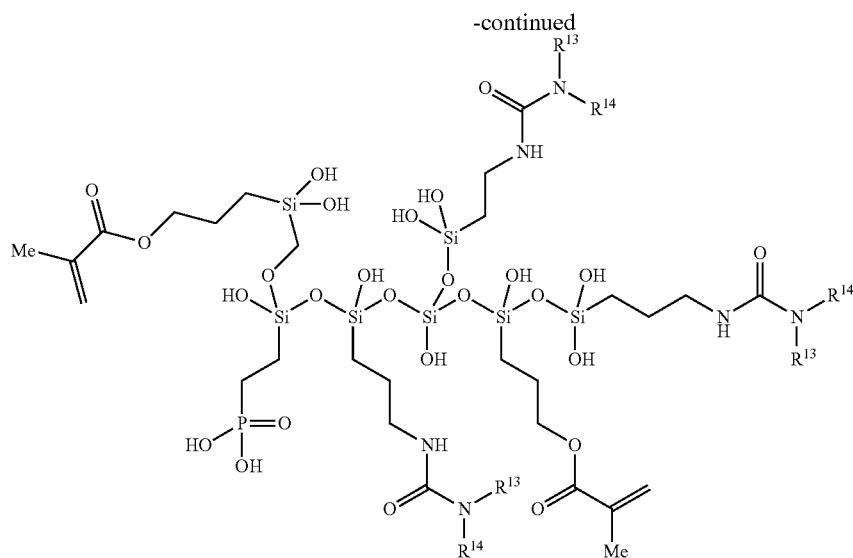

General Procedure:

To a mixture of [2-(triethoxysilyl)ethyl]-phosphonic acid (Compound III-1) and the ethanol solutions of the triethoxysilanes according to Formula II described above (see Table 2), (3-methacryloxypropyl)-triethoxysilane (Compound I-1) was added. Subsequently, the specified amount of water and/or ethanol was added and the mixture was stirred for 15 minutes. The reaction was allowed to continue for 20 hours at room temperature. Table 4 specifies the amount of the reagentia.

The obtained polymer solution was used directly in the preparation of the coating solutions.

TABLE 4 polysiloxanes Silox-05 to Silox-28 including organosilicon compounds of Formula (I), Formula (II) and Formula (III).

| | Compound I-1 g (mol) | Compounds according to Formula II* g (mol)** | Compound III-1 g (mol) | EtOH ml | H$_2$O ml |
|---|---|---|---|---|---|
| Silox-05 | 0.60 (0.0024) | II-1 4.86 (0.011) | 0.65 (0.0024) | — | 10 |
| Silox-06 | 0.40 (0.0016) | II-1 4.86 (0.011) | 0.84 (0.0031) | — | 10 |
| Silox-07 | 1.1 (0.0043) | II-2 7.0 (0.02) | 1.17 (0.0043) | — | 20 |
| Silox-08 | 0.72 (0.0029) | II-2 7.0 (0.02) | 1.55 (0.0057) | — | 20 |
| Silox-09 | 1.0 (0.0041) | II-3 6.4 (0.019) | 1.12 (0.0041) | 23.8 | 1.47 |
| Silox-10 | 0.67 (0.0027) | II-3 6.4 (0.019) | 1.47 (0.0054) | 23.8 | 1.47 |
| Silox-11 | 4.8 (0.02) | II-4 30.8 (0.091) | 5.44 (0.02) | — | 90 |
| Silox-12 | 9.4 (0.038) | II-4 30.8 (0.091) | 6.2 (0.023) | — | 90 |
| Silox-13 | 1.0 (0.0041) | II-5 6.7 (0.019) | 1.12 (0.0041) | — | 20 |
| Silox-14 | 1.96 (0.0079) | II-5 6.7 (0.019) | 1.28 (0.0047) | — | 20 |

TABLE 4-continued polysiloxanes Silox-05 to Silox-28 including
organosilicon compounds of Formula (I), Formula (II) and Formula (III).

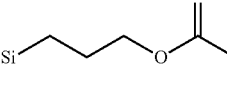

| | Compound I-1 g (mol) | Compounds according to Formula II* g (mol)** | Compound III-1 g (mol) | EtOH ml | H₂O ml |
|---|---|---|---|---|---|
| Silox-15 | 1.0 (0.0041) | II-6 7.0 (0.019) | 1.12 (0.0041) | — | 20 |
| Silox-16 | 1.96 (0.0079) | II-6 7.0 (0.019) | 1.28 (0.0047) | — | 20 |
| Silox-17 | 1.0 (0.0041) | II-7 5.85 (0.019) | 1.12 (0.0041) | — | 20 |
| Silox-18 | 1.96 (0.0079) | II-7 5.85 (0.019) | 1.28 (0.0047) | — | 20 |
| Silox-19 | 1.0 (0.0041) | II-8 6.1 (0.019) | 1.12 (0.0041) | — | 20 |
| Silox-20 | 1.96 (0.0079) | II-8 6.1 (0.019) | 1.28 (0.0047) | — | 20 |
| Silox-21 | 1.0 (0.0041) | II-9 6.1 (0.019) | 1.12 (0.0041) | — | 20 |
| Silox-22 | 1.96 (0.0079) | II-9 6.1 (0.019) | 1.28 (0.0047) | — | 20 |
| Silox-23 | 1.0 (0.0041) | II-10 6.1 (0.019) | 1.12 (0.0041) | — | 20 |
| Silox-24 | 1.96 (0.0079) | II-10 6.1 (0.019) | 1.28 (0.0047) | — | 20 |
| Silox-25 | 1.0 (0.0041) | II-11 6.65 (0.019) | 1.12 (0.0041) | — | 20 |
| Silox-26 | 1.96 (0.0079) | II-11 6.65 (0.019) | 1.28 (0.0047) | — | 20 |
| Silox-27 | 1.0 (0.0041) | II-12 6.69 (0.019) | 1.12 (0.0041) | — | 20 |
| Silox-28 | 1.96 (0.0079) | II-12 6.69 (0.019) | 1.28 (0.0047) | — | 20 |

*see Table 2;
**in 5 ml ethanol

6. Synthesis of the Comparative Polysiloxane Comprising an Organosilicon Compound According to Formula (I) and Formula (III): Silox-29 (Table 5).

General Procedure:

8.4 g (0.026 mol) [2-(triethoxysilyl)ethyl]-phosphonic acid diethyl ester was dissolved in 70 ml methylene chloride. 9.2 g trimethylsilyl bromide was added and the reaction was allowed to continue for 90 minutes at room temperature. The solvent was removed under reduced pressure and 17.5 ml ethanol was added. The solvent was removed under reduced pressure. The residual oil containing [2-(triethoxysilyl) ethyl]-phosphonic acid (compound III-1) was dissolved in 17.5 ml ethanol. 2.5 g (0.012 mol) tetraethoxysilane and 3 g (0.012 mol) (3-methacryloxypropyl)-triethoxysilane (compound I-1) were dissolved in the ethanol solution and 20 ml water was added. The reaction was allowed to continue for 48 hours at room temperature and polysiloxane Silox-29 is obtained. The polymer solution was used as such in the printing plate coating solutions.

7. Synthesis of the Comparative Polysiloxanes Silox-30 and Silox-31.

General Procedure:

Synthesis of the Comparative Organosilicon Compound COMPSIL-1:

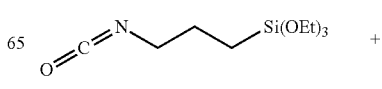

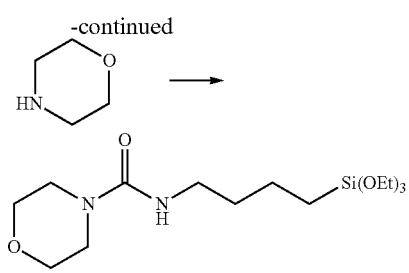

1.6 g (19 mmol) of morpholine was dissolved in 5 ml ethanol. 4.9 g (19 mmol) of 3-isocyanatopropyl-triethoxysilane was added dropwise. The reaction temperature rose to 45° C. upon addition. The reaction was allowed to continue at room temperature for an additional two hours. The solution containing COMPSIL-1 was used as such for further polymerisation.

Synthesis of the Comparative Polysiloxane Silox-30 (Table 5):

1.18 g (4.4 mmol) of [2-(triethoxysilyl)ethyl-]-phosphonic acid (compound III-1) was dissolved in the ethanol solution of COMPSIL-1 described above. 1 g (4.1 mmol) of (3-methacryloxypropyl)-trimethoxysilane was added, followed by the addition of 20 ml water. The temperature rose to 30° C. upon the addition of water. The reaction was allowed to continue at room temperature for 20 hours. 20 ml ethanol was added and the reaction mixture was filtered over a 0.45 μm filter. The reaction mixture was used as such in the printing plate precursor preparation.

Synthesis of the Comparative Organosilicon Compound COMPSIL-2:

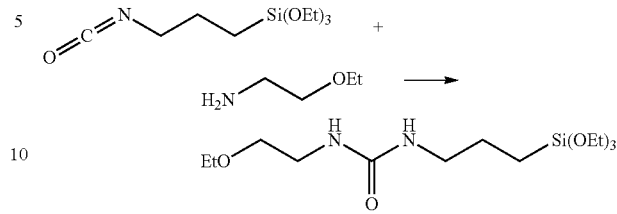

1.6 g (19 mmol) of 2-ethoxy-ethylamine was dissolved in 5 ml ethanol. 4.9 g (19 mmol) of 3-isocyanatopropyl-triethoxysilane was added dropwise. The reaction temperature rose to 30° C. upon addition. The reaction was allowed to continue at room temperature for an additional two hours. The solution containing COMPSIL-2 was used as such for further polymerisation.

Synthesis of the Comparative Polysiloxane Silox-31 (Table 5):

1.18 g (4.4 mmol) of [2-(triethoxysilyl)ethyl-]-phosphonic acid (compound III-1) was dissolved in the ethanol solution of COMPSIL-2 described above. 1 g (4.1 mmol) of (3-methacryloxypropyl)-trimethoxysilane was added, followed by the addition of 20 ml water. The temperature rose to 34° C. upon the addition of water. The reaction was allowed to continue at room temperature for 20 hours. 12 ml ethanol was added and the reaction mixture was filtered over a 0.45 μm filter. The reaction mixture was used as such in the printing plate precursor preparation.

TABLE 5 comparative polysiloxanes Silox-29, Silox-30 and Silox-31

| | First unit | Second unit | Third unit |
|---|---|---|---|
| Silox-29 | compound I-1 | — | Compound III-1 |
| Silox-30 | compound I-1 | Comparative compound COMPSIL-1 | Compound III-1 |
| Silox-31 | compound I-1 | Comparative compound COMPSIL-2 | Compound III-1 |

8. Synthesis of the Polysiloxanes Silox-32 to Silox-41 by Reacting the Organosilicon Compounds of Formula (I), Formula (II) and Formula (III):

Reaction Scheme (Example):

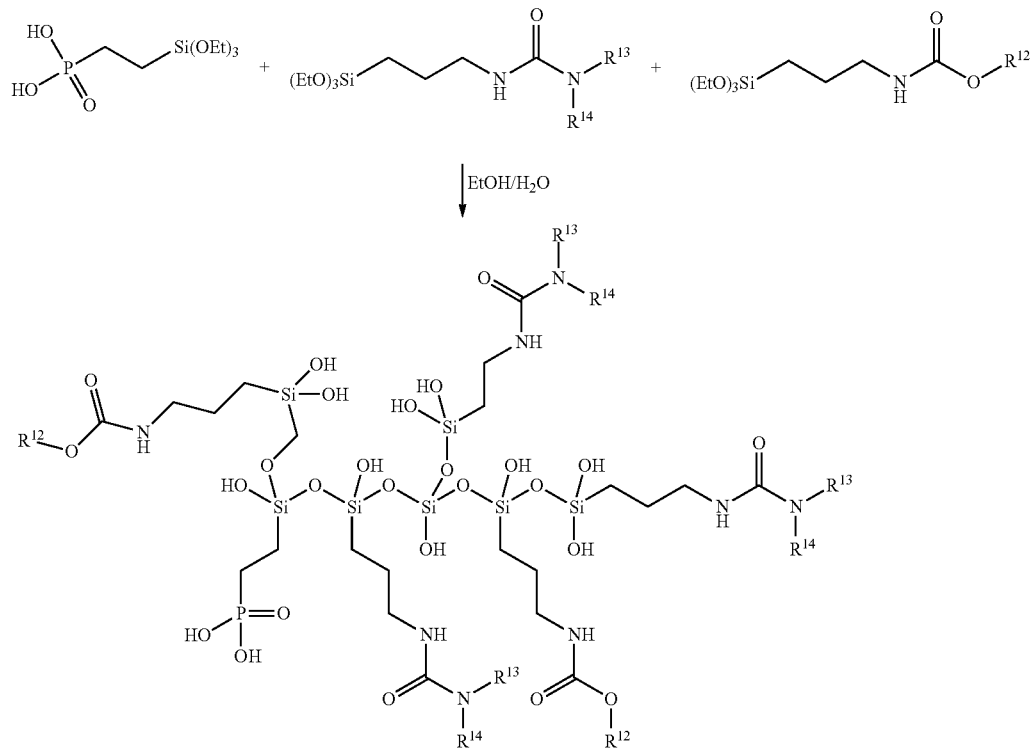

General Procedure:

The ethanol solution of the triethoxysilanes according to Formula II (compounds II-2 or II-7; see Table 2) was added to [2-(triethoxysilyl)ethyl]-phosphonic acid (Compound III-1). The mixture was stirred for 20 minutes. Subsequently, the mixture was added to a compound according to Formula I (Table 1 above). The mixture was stirred for 30 minutes. Subsequently, 20 ml of water was added and the reaction was allowed to continue for 20 hours at room temperature. Table 6 specifies the amount of the reagentia. The obtained polymer solution was used directly in the preparation of the coating solutions.

TABLE 6 polysiloxanes Silox-32 to Silox-41 including organosilicon compounds of Formula (I), Formula (II) and Formula (III)

|  | Compound according to Formula I* g (mol) | Compound according to Formula II g (mol)* | Compound III-1 g (mol) |
|---|---|---|---|
| Silox-32 | I-29 with n = 1<br>1.55<br>(0.0041) | II-7<br>5.85<br>(0.019) | 1.12<br>(0.0041) |
| Silox-33 | I-29 with n = 1<br>1.55<br>(0.0041) | II-2<br>6.69<br>(0.019) | 1.12<br>(0.0041) |
| Silox-34 | I-29 with n = 5<br>2.27<br>(0.0041) | II-7<br>5.85<br>(0.019) | 1.12<br>(0.0041) |
| Silox-35 | I-29 with n = 5<br>2.27<br>(0.0041) | II-2<br>6.69<br>(0.019) | 1.12<br>(0.0041) |

TABLE 6-continued polysiloxanes Silox-32 to Silox-41 including
organosilicon compounds of Formula (I), Formula (II) and Formula (III)

| | Compound according to Formula I* g (mol) | Compound according to Formula II** g (mol)*** | Compound III-1 g (mol) |
|---|---|---|---|
| Silox-36 | I-29 with n = 10<br>3.17<br>(0.0041) | II-7<br>5.85<br>(0.019) | 1.12<br>(0.0041) |
| Silox-37 | I-29 with n = 10<br>3.17<br>(0.0041) | II-2<br>6.69<br>(0.019) | 1.12<br>(0.0041) |
| Silox-38 | I-31<br>2.24<br>(0.0041) | II-7<br>5.85<br>(0.019) | 1.12<br>(0.0041) |
| Silox-39 | I-31<br>2.24<br>(0.0041) | II-2<br>6.69<br>(0.019) | 1.12<br>(0.0041) |
| Silox-40 | I-22<br>1.95<br>(0.0041) | II-7<br>5.85<br>(0.019) | 1.12<br>(0.0041) |
| Silox-41 | I-22<br>1.95<br>(0.0041) | II-2<br>6.69<br>(0.019) | 1.12<br>(0.0041) |

*see Table 1;
**see Table 2;
***in 5 ml ethanol.

II. Preparation of the Printing Plates

1. Example 1

Preparation of the Aluminium Support S-01

A 0.3 mm thick aluminium foil was degreased by spraying with an aqueous solution containing 26 g/l NaOH at 65° C. for 2 seconds and rinsed with demineralised water for 1.5 seconds. The foil was then electrochemically grained during 10 seconds using an alternating current in an aqueous solution containing 15 g/l HCl, 15 g/l $SO_4^{2-}$ ions and 5 g/l $Al^{3+}$ ions at a temperature of 37° C. and a current density of about 100 A/dm². Afterwards, the aluminium foil was then desmutted by etching with an aqueous solution containing 5.5 g/l of NaOH at 36° C. for 2 seconds and rinsed with demineralised water for 2 seconds. The foil was subsequently subjected to anodic oxidation during 15 seconds in an aqueous solution containing 145 g/l of sulfuric acid at a temperature of 50° C. and a current density of 17 A/dm², then washed with demineralised water for 11 seconds and dried at 120° C. for 5 seconds.

The support S-01 thus obtained was characterised by a surface roughness Ra of 0.35-0.4 µm (measured with interferometer NT1100) and had an anodic weight of 3.0 g/m².
Preparation of Inventive Printing Plates PP-01 to PP-15 and Comparative Printing Plates PP-16 to PP-18.
Coating
Photopolymerizable Layer The printing plate precursors PPP-01 to PPP-18 were produced by coating onto the above described support S-01 the components as defined in Table 7 dissolved in a mixture of 40% by volume of MEK and 60% by volume of Dowanol PM (1-methoxy-2-propanol, commercially available from DOW CHEMICAL Company). The coating solution was applied at a wet coating thickness of 20 µm and then dried at 120° C. for 1 minute in a circulation oven.

TABLE 7 composition and dry coating weight of the photopolymerisable layer PL-01.

| INGREDIENT (g/m²) | PL-01 |
|---|---|
| Fluomix (1) | 0.052 |
| Binder-01 (2) | 0.1 |
| FST 426R (3) | 0.225 |
| SR368 (4) | 0.225 |
| Tegoglide 410 (5) | 0.001 |
| HABI (6) | 0.078 |
| Pig-disp-01 (7) | 0.120 |
| MBT (8) | 0.021 |
| Polysiloxane (9) | 0.1 |
| Dry coating weight | 0.922 |

(1) Fluomix is a violet sensitizer mixture consisting of the following compounds:

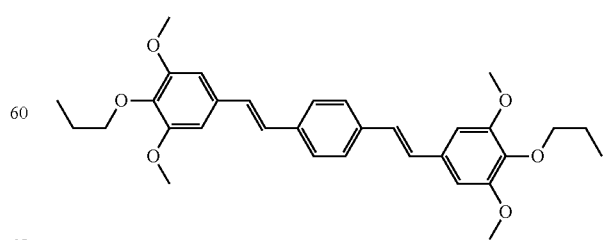

15 wt. %

-continued

[chemical structure] 38 wt. %

[chemical structure] 47 wt. %

(2) Binder-1 represents Gohsemfimer L-5407™, a 36% hydrolyzed polyvinyl acetate commercially available from NIPPON GOHSEI;
(3) FST 426R™ is a reaction product from 1 mole of 2,2,4-trimethyl-hexamethylenediisocyanate and 2 moles of hydroxyethyl-methacrylate;
(4) SR368™ is tris(2-hydroxy ethyl) isocyanurate triacrylate commercially available from Sartomer;
(5) Tegoglide 410™ is a surfactant commercially available from Evonik Tego Chemie GmbH;
(6) HABI is 2,2'-bis(o-chlorophenyl)-4,4',5,5'-tetraphenylbi-imidazole commercially available from SUMITOMO;
(7) Pig-disp-01 contains in a 50/50 ratio Hostaperm Blue P-BFS™ commercially available from Clariant and Disperbyk 182 commercially available from BYK Chemie GmbH.;
(8) MBT is 2-mercaptobenzthiazole;
(9) polysiloxane of Tables 3, 4 and 5.

Top Layer

On top of the photosensitive layer, a solution in water with the composition as defined in Table 8 was coated (40 μm) on the printing plate precursors PPP-01 to PPP-18 and dried at 110° C. for 2 minutes. The so-formed protective top layer OC-1 has a dry thickness or dry coating weight of 1.25 g/m².

TABLE 8

Composition of the top layer solution OC-01.

| INGREDIENT (g) | OC-01 |
|---|---|
| Mowiol 4-88 (1) | 19.1 |
| Mowiol 8-88 (1) | 5.84 |
| Luviskol K30 (2) | 5.95 |
| Acticide LA1206 (3) | 0.06 |
| Lutensol A8 (4) | 0.30 |
| Water | 969 |

(1) Mowiol 4-88™ and Mowiol 8-88™ are partially hydrolyzed polyvinylalcohols commercially available from Kuraray;
(2) Luviskol K30™ is polyvinylpyrrolidone homopolymer commercially available from BASF;
(3) Acticide LA1206™ is a biocide commercially available from Thor;
(4) Lutensol A8™ is a surface active agent commercially available from BASF.

Artificial Ageing

Each printing plate precursor PPP-01 to PPP-18 was cut into two parts. The first part is further referred to as the "fresh" printing plate precursor. The second part of each precursor was artificially aged by storing it during 5 days in a cabinet conditioned at 57° C. and 34% R.H. This second part is further referred to the "aged" printing plate precursor. After ageing the "aged" printing plate precursor was allowed to cool down to room temperature before imaging.

Imaging

Both the "fresh" and "aged" printing plate precursors were subsequently imaged either with a Galileo VXT platesetter at 2400 dpi (200 lpi Agfa Balanced Screening (ABS)) or a Polaris VXT platesetter at 1270 dpi (110 lpi Agfa Balanced Screening (ABS))(both commercially available from Agfa Graphics NV and equipped with a 405 nm violet laser diode) and this at energy densities between 50 and 90 μJ/cm².

Processing

After imaging, both the "fresh" and "aged" printing plate precursors were subjected to processing with Gum-1 in a CRF45 Processor™ (dwell time 30 s, at 21° C.), available from Agfa Graphics, to remove the coating in the non-image areas from the support. Printing plates PP-01 to PP-18 were obtained.

Gum-1 is a solution prepared as follow:
  To 650 ml demineralised water
  67 ml of Emulsogen TS 160™, a non-ionic surfactant (commercially available from Clariant);
  21.21 ml sodium n-octyl sulfate commercially available from Henkel as a 42 wt % solution in water;
  25 g of potato dextrine Avedex 37 commercially available from Avebe BA;
  3.01 g of orthophosphoric acid;
  7 g of triethanolamine and
  9.5 ml phenoxypropanol commercially available from BASF were added under stirring and demineralised water was further added to make 1000 ml.
  The pH is 7 at room temperature.

Results

Evaluation of the Stain Resistance of the "Aged" Printing Plates

The density of the non-image areas ($D_{min}$) of the plates after imaging and processing was determined and is a measure of the stain resistance of the plate. The density is measured using a Gretag-MacBeth DC19 densitometer (commercially available from GretagMacbeth AG, cyan filter setting, zeroed on a non-coated piece of aluminium substrate AS-01). A $D_{min}$ value higher than 0.05 is unacceptable.

The results of the Dmin evaluation obtained for the "aged" printing plates are given in Table 9.

TABLE 9

Dmin results

| Printing plate | | D min "aged" samples |
|---|---|---|
| PP-01 (inv) | Silox-01 | 0.01 |
| PP-02 (inv) | Silox-02 | 0.01 |
| PP-03 (inv) | Silox-03 | 0.01 |
| PP-04 (inv) | Silox-04 | 0.01 |
| PP-05 (inv) | Silox-05 | 0.01 |
| PP-06 (inv) | Silox-06 | 0.01 |
| PP-07 (inv) | Silox-07 | 0.01 |
| PP-08 (inv) | Silox-09 | 0.05 |

TABLE 9-continued

Dmin results

| Printing plate | | D min "aged" samples |
|---|---|---|
| PP-09 (inv) | Silox-11 | 0.01 |
| PP-10 (inv) | Silox-13 | 0.01 |
| PP-11 (inv) | Silox-15 | 0.04 |
| PP-12 (inv) | Silox-17 | 0.02 |
| PP-13 (inv) | Silox-19 | 0.05 |
| PP-14 (inv) | Silox-21 | 0.02 |
| PP-15 (inv) | Silox-27 | 0.01 |
| PP-16 (comp) | Silox-29 | 0.1 |
| PP-17 (Comp) | Silox-30 | 0.37 |
| PP-18 (Comp) | Silox-31 | 0.1 |

The results show that the Dmin results of the "aged" printing plates containing the polysiloxane according to a preferred embodiment of the present invention result in printing plates with an acceptable $D_{min}$ after imaging and development (i.e. no stain in the non-image areas). When the comparative polysiloxane is present, a non-acceptable stain occurs in the non-image areas after imaging and development.

Printing Results

After processing, the "fresh" printing plates PP-01 to PP-18 were mounted on a Heidelberg GTO 46™ printing press (available form Heidelberg). Each print job was started using K+E Novavit 800 Skinnex Ink™ (trademark of BASF Druckfarben GmbH) and 2 wt % Prima FS404™ (trademark of Agfa Graphics) in water as fountain solution. A compressible blanket was used and printing was performed on non-coated offset paper. Each plate was printed up to 250 sheets. The 250$^{th}$ printed sheet was evaluated both with regard to toning (unwanted ink acceptance in the non-image parts) and to the rendering of the small dots at 110 or 200 lpi ABS (Agfa Balanced screening, commercially available from Agfa Graphics N.V.), depending on the platesetter used.

The results of the evaluation of the printed sheets (toning, rendering of the small dots) is given in Table 10. The rendering of the small dots on the printed sheet was evaluated with a 50× magnification hand microscope. Smallest dot is defined as the smallest % dot visible upon 8× magnification. The lower the number, the better the image sensitivity of the printing plate.

TABLE 10

Results for the Printing plates PP-01 to PP-18.

| Printing plate | Smallest dots rendered on paper (%) | Clean-out (printed sheet)** |
|---|---|---|
| PP-01 (inv) | 5 | 0 |
| PP-02 (inv) | 3 | 0 |
| PP-03 (inv) | 5 | 0 |
| PP-04 (inv) | 5 | 0 |
| PP-05 (inv) | 3 | 0 |
| PP-06 (inv) | 3 | 0 |
| PP-07 (inv) | 2 | 1 |
| PP-08 (inv) | 1 | 1 |
| PP-09 (inv) | 4 | 0 |
| PP-10 (inv) | 1 | 1 |
| PP-11 (inv) | 3 | 0 |
| PP-12 (inv) | 1 | 1 |
| PP-13 (inv) | 2 | 1 |
| PP-14 (inv) | 1 | 1 |
| PP-15 (inv) | 2 | 0 |
| PP-16 (comp) | 2 | 3 |

TABLE 10-continued

Results for the Printing plates PP-01 to PP-18.

| Printing plate | Smallest dots rendered on paper (%) | Clean-out (printed sheet)** |
|---|---|---|
| PP-17 (comp) | * | 4 |
| PP-18 (comp) | * | 4 |

*cannot properly be evaluated (due to bad clean-out)

**0 = good, very slight stain;

1 = slight stain, some stain, slight toning, slightly speckled toning;

2 = stain, speckled toning;

3 = much stain;

4 = black pages.

The results in Table 10 show that the invention printing plates have an excellent laser sensitivity (smallest % dot values ranging between 1 and 5). In addition, the results of Table 10 demonstrate that the presence of the siloxanes according to a preferred embodiment of the present invention in the printing plate results in an excellent clean-out behaviour.

2. Example 2

Preparation of Inventive Printing Plates PP-19 to PP-21 and Comparative Printing Plate PP-22

Coating

Photopolymerizable Layer

The printing plate precursors PPP-19 to PPP-22 were prepared by coating onto the above described support S-01 (see Example 1) the components as defined in Table 11 dissolved in a mixture of 40% by volume of MEK and 60% by volume of Dowanol PM (1-methoxy-2-propanol, commercially available from DOW CHEMICAL Company). The coating solution was applied at a wet coating thickness of 20 μm and then dried at 120° C. for 1 minute in a circulation oven.

TABLE 11

Composition and dry coating weight of the photopolymerisable layer PL-02.

| INGREDIENT (g/m$^2$) | PL-02 |
|---|---|
| IR dye (1) | 0.024 |
| Binder-02 (2) | 0.150 |
| FST 426R (3) | 0.281 |
| CN-UVE 151M (4) | 0.281 |
| Tegoglide 410 (5) | 0.0015 |
| p-OH-TBMPS (6) | 0.06 |
| Pig-disp-01 (7) | 0.120 |
| Siloxane (8) | 0.100 |
| Dry coating weight | 1.0175 |

(1) IR dye is an infrared absorbing dye having the following structure:

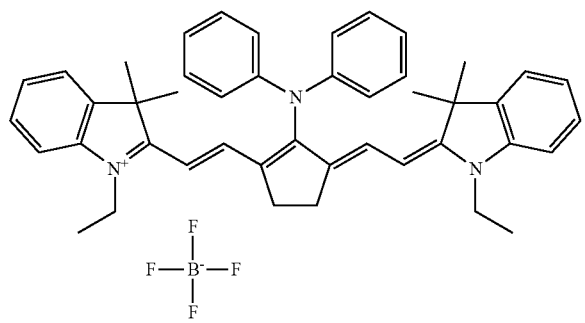 [SMILES: CCN1/C(=C/C=C2\CCC(/C=C/C3=[N+](CC)c4ccccc4C3(C)C)=C2N(c2ccccc2)c2ccccc2)C(C)(C)c2ccccc21 ; F[B-](F)(F)F]

(2) Binder-02 represents Mowital B30T™, a vinyl butyral polymer commercially available from Sekisui;
(3) See Table 7;
(4) CN-UVE 151M™ is an epoxy diacrylate monomer commercially available from Sartomer;
(5) See Table 7;
(6) p-OH-TBMPS is 4-hydroxyphenyl-tribromomethyl-sulfone

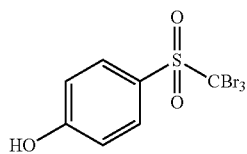

(7) see Table 7;
(8) polysiloxane as indicated in Tables 4 and 12.

Top Layer

On top of the photosensitive layer the protective top layer OC-1 (see Example 1) was coated on the printing plate precursors PPP-19 to PPP-22 and dried at 110° C. for 2 minutes. The so-formed protective top layer OC-1 has a dry thickness or dry coating weight of 1.25 g/m².

Artificial Ageing

Each printing plate precursor PPP-19 to PPP-22 was cut into two parts. The first part is further referred to as the "fresh" printing plate precursor. The second part of each precursor was artificially aged in the same way as in Example 1.

Imaging

Both the "fresh" and "aged" printing plate precursors were subsequently imaged at 2400 dpi with a Creo 3244T™ thermal platesetter (200 lpi Agfa Balanced Screening (ABS)), commercially available from Kodak and equipped with a 830 nm IR laser diode, at energy densities between 70 and 130 mJ/cm².

Processing

After imaging, both the "fresh" and "aged" printing plate precursors were subjected to processing with Gum-2 in a CRF45 Processor™ (dwell time 30 s, at 21° C.), available from Agfa Graphics, to remove the coating on the non-image areas from the support. Printing plates PP-19 to PP-22 were obtained.

Gum-2 is a solution prepared as follow:
To 650 ml demineralised water
67 ml of Emulsogen TS 160™, a non-ionic surfactant commercially available from Clariant;
21.21 ml sodium n-octyl sulfate commercially available from Henkel as a 42% solution in water;
70 g of potato dextrine Avedex 37 commercially available Avebe BA;
5 g of potassium hydrogen phosphate;
2.35 g of sodium hydroxide (50 wt % aqueous solution) and 9.5 ml phenoxypropanol commercially available from BASF were added under stirring and demineralised water was further added to make 1000 ml.

The pH is 7 at room temperature.

Results

Evaluation of the Stain Resistance of the "Aged" Printing Plates

The density of the non-image areas ($D_{min}$) of the plates after imaging and processing was determined and is a measure of the stain resistance of the plate. The density is measured using a Gretag-MacBeth DC19 densitometer (commercially available from GretagMacbeth AG, cyan filter setting, zeroed on a non-coated piece of aluminium substrate AS-01). A $D_{min}$ value higher than 0.05 is unacceptable.

The results of the Dmin evaluation obtained for the "aged" printing plates are given in Table 12.

TABLE 12

| | Dmin results | |
|---|---|---|
| Printing plate | | D min "aged sample" |
| PP-19 (inv) | Silox-17 | 0.03 |
| PP-20 (inv) | Silox-19 | 0.04 |
| PP-21 (inv) | Silox-27 | 0.04 |
| PP-22 (comp) | Silox-42** | * |

*cannot be evaluated due to bad clean-out/no image formation;
**comparative polysiloxane described and synthesized in U.S. Pat. No. 7,524,613 in column 13 and 14 (polysiloxane III-a) and including the following organosilicon compound:

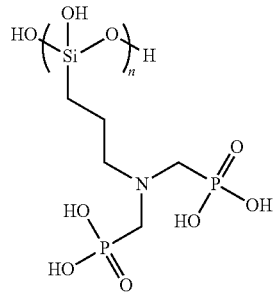

The results in Table 12 show that the Dmin results of the "aged" printing plates containing the polysiloxane according to a preferred embodiment of the present invention result in printing plates with an acceptable $D_{min}$ after imaging and development (i.e. no stain in the non-image areas). When the comparative polysiloxane is present, no image was formed.

Printing Results

The "fresh" printing plates were used in the printing process in the same way as in Example 1. Also the evaluation of the resulting 250$^{th}$ printed sheet was performed in the same way.

The results of the evaluation of the printed sheets (toning and rendering of the small dots) is given in Table 13. The rendering of the small dots on the printed sheet was evaluated with a 50× magnification hand microscope. Smallest dot is defined as the smallest % dot visible upon 8× magnification. The lower the number, the more sensitive the printing plate.

TABLE 13

Printing results for the printing plates PP-19 to PP-22

| Printing plate precursor | Smallest dots rendered on paper | Clean-out (printed sheet)** |
|---|---|---|
| PP-19 (inv) | 3 | 0 |
| PP-20 (inv) | 5 | 0 |
| PP-21 (inv) | 5 | 0 |
| PP-22 (comp) | * | 4 |

*cannot properly be evaluated (due to bad clean-out, no image formation)
**0 = good, very slight stain
1 = slight stain, slightly speckled toning
2 = stain, speckled toning
3 = much stain
4 = black pages The results in Table 13 show that the invention printing plates have an excellent highlight rendering: smallest % dot values ranging between 1 and 5. In addition, the results of Table 13 demonstrate that the presence of the siloxanes according to a preferred embodiment of the present invention in the printing plate results in an excellent clean-out behaviour.

3. Example 3

Preparation of Inventive Printing Plates PP-23 to PP-34 and Comparative Printing Plate PP-35

Coating
Photopolymerizable Layer

The inventive printing plate precursors PPP-23 to PPP-34 and comparative printing plate precursor PPP-35 were produced by respectively coating onto the above described support S-01 (see Example 1) PL-03 and PL-04 (components as defined in Table 14) dissolved in a mixture of 40% by volume of MEK and 60% by volume of Dowanol PM (1-methoxy-2-propanol, commercially available from DOW CHEMICAL Company). The coating solution was applied at a wet coating thickness of 20 μm and then dried at 120° C. for 1 minute in a circulation oven.

TABLE 14

Composition and dry coating weight of the photopolymerisable layer PL-03 and PL-04.

| INGREDIENT ($g/m^2$) | PL-03 | PL-04 |
|---|---|---|
| Fluomix (1) | 0.050 | 0.050 |
| Poly(vinyl acetate) (2) | 0.150 | 0.150 |
| FST 426R (3) | 0.600 | 0.600 |
| Tegoglide 410 (4) | 0.0015 | 0.0015 |
| HABI (5) | 0.075 | 0.075 |
| Pig-disp-01 (6) | 0.120 | 0.120 |
| MBT (7) | 0.020 | 0.020 |
| Polysiloxane (8) | 0.050 | — |
| Albritect CP30 (9) | — | 0.024 |
| Sipomer PAM 100 (10) | — | 0.13 |
| Dry coating weight | 1.0665 | 1.1705 |

(1, 3-7) See Table 7;
(2) Mw on average 500.000, commercially available from Aldrich, (8) see Tables 4 and 6;
(9) copolymer of vinyl phosphonic acid and acrylic acid, commercially available from RHODIA;
(10) phosphate functionalized speciality methacrylate monomer; 50 wt % solution in Dowanol PM, commercially available from RHODIA as an undiluted liquid.

Top Layer

On top of the photosensitive layer the protective top layer OC-1 (see Example 1) was coated on the printing plate precursors PPP-23 to PPP-35 and dried at 110° C. for 2 minutes. The so-formed protective top layer OC-1 has a dry thickness or dry coating weight of 1.25 $g/m^2$.

Imaging

The printing plate precursors PPP-23 to PPP-35 were subsequently imaged either with a Galileo VXT platesetter at 2400 dpi (200 lpi Agfa Balanced Screening (ABS)) or a Polaris VXT platesetter at 1270 dpi (110 lpi Agfa Balanced Screening (ABS))(both commercially available from Agfa Graphics NV and equipped with a 405 nm violet laser diode) and this at energy densities between 40 and 90 $\mu J/cm^2$.

Processing

After imaging, the obtained printing plate precursors were subjected to processing with the gum solution VIOLET CF GUM-NP™ commercially available from Agfa-Gevaert NV in a CRF45 Processor™ (dwell time 30 s, at 21° C.), available from Agfa Graphics, to remove the coating in the non-image areas from the support. Printing plates PP-23 to PP-35 were obtained.

Results
Sensitivity

Exposure was carried out on an Agfa Polaris X violet plate Setter™ at 1270 dpi through an UGRA Step Wedge (wedge constant of 0.15). The sensitivity, i.e. right exposure, was determined for each printing plate precursor. The sensitivity is defined as the exposure energy density (in $\mu J/cm^2$) needed to obtain an optical density >97% of the maximum optical density that can be obtained on this plate after processing on the first three wedge steps.

The sensitivity results obtained for PP-23 to PP-35 are given in Table 15.

TABLE 15

Sensitivity results of PP-23 to PP-35.

| Printing plate | siloxane | Including organosilicon comp. according to Formula I including —(O—CH2—CH2)$_n$— | Amount of unsaturated bonds | Comparative compounds | Sensitivity ($\mu J/cm^2$)* |
|---|---|---|---|---|---|
| PP-23 Inv. | Silox-07 | n = 0 | 1 | — | 76 |
| PP-24 Inv. | Silox-17 | n = 0 | 1 | — | 71 |
| PP-25 Inv. | Silox-32 | n = 1 | 1 | — | 76 |
| PP-26 Inv. | Silox-33 | n = 1 | 1 | — | 76 |
| PP-27 Inv. | Silox-34 | n = 5 | 1 | — | 67 |
| PP-28 Inv. | Silox-35 | n = 5 | 1 | — | 67 |
| PP-29 Inv. | Silox-36 | n = 10 | 1 | — | 57 |
| PP-30 Inv. | Silox-37 | n = 10 | 1 | — | 57 |

TABLE 15-continued

Sensitivity results of PP-23 to PP-35.

| Printing plate | Including organosilicon comp. according to Formula I | | | Comparative compounds | Sensitivity ($\mu J/cm^2$)* |
|---|---|---|---|---|---|
| | including siloxane | —(O—CH2—CH2)$_n$— | Amount of unsaturated bonds | | |
| PP-31 Inv. | Silox-38 | n = 0 | 2 | — | 62 |
| PP-32 Inv. | Silox-39 | n = 0 | 2 | — | 62 |
| PP-33 Inv. | Silox-40 | n = 0 | 3 | — | 48 |
| PP-34 Inv. | Silox-41 | n = 0 | 3 | — | 57 |
| PP-35 Comp. | — | — | — | Albritect CP30 and Sipomer PAM 100 | 150 |

The results in Table 15 show that the invention printing plates PP-23 to PP-34 including a siloxane according to a preferred embodiment of the present invention have a significantly improved laser sensitivity compared to the comparative printing plate PP-35.

The results show that the spacer length (in terms of amount of —(O—CH$_2$—CH$_2$)$_n$—) and/or the amount of double bonds in the organosilicon compound according to Formula I included in the siloxane compound, have a significant effect on the sensitivity of the printing plate: longer spacers and/or more double bonds in the siloxane compound significantly improve the sensitivity of the printing plate.

4. Example 4

Preparation of Inventive Printing Plates PP-36 to PP-46 and Comparative Printing Plate PP-47

Coating
Photopolymerizable Layer

The inventive printing plate precursors PPP-36 to PPP-46 and comparative printing plate precursor PPP-47 were produced by respectively coating onto the above described support S-01 (see Example 1) PL-05 and PL-06 (components as defined in Table 16) dissolved in a mixture of 40% by volume of MEK and 60% by volume of Dowanol PM (1-methoxy-2-propanol, commercially available from DOW CHEMICAL Company). The coating solution was applied at a wet coating thickness of 20 μm and then dried at 120° C. for 1 minute in a circulation oven.

TABLE 16

Composition and dry coating weight of the photopolymerisable layers PL-05 and PL-06.

| INGREDIENT (g/m²) | PL-05 | PL-06 |
|---|---|---|
| IR dye (1) | 0.022 | 0.022 |
| Poly(vinyl acetate) (2) | 0.150 | 0.150 |
| FST 426R (3) | 0.600 | 0.600 |
| Tegoglide 410 (4) | 0.0015 | 0.0015 |
| p-OH-TBMPS (5) | 0.060 | 0.060 |
| Pig-disp-01 (6) | 0.120 | 0.120 |
| Siloxane (7) | 0.050 | — |
| Albritect CP30 (8) | — | 0.024 |
| Sipomer PAM100 (9) | — | 0.13 |
| Dry coating weight | 1.0035 | 1.1075 |

(1 and 3 to 6) see Table 11;
(7) see Tables 4 and 6;
(2), (8) and 9) see Table 14

Top Layer

On top of the photosensitive layer the protective top layer OC-1 (see Example 1) was coated on the printing plate precursors PPP-36 to PPP-48 and dried at 110° C. for 2 minutes. The so-formed protective top layer OC-1 has a dry thickness or dry coating weight of 1.25 g/m².

Imaging

The printing plate precursors were subsequently imaged at 2400 dpi with a Creo 3244T thermal Platesetter™ (200 lpi Agfa Balanced Screening (ABS)), commercially available from Kodak and equipped with a 830 nm IR laser diode, at energy densities between 70 and 150 mJ/cm2.

Processing

After imaging the printing plate precursors were subjected to processing with the gum solution VIOLET CF GUM-NP™ commercially available from Agfa-Gevaert NV in a CRF45 Processor™ (dwell time 30 s, at 21° C.), available from Agfa Graphics, to remove the coating in the non-image areas from the support. Printing plates PP-36 to PP-48 were obtained.

Results
Sensitivity

Exposure was carried out on a Creo 3244T thermal Platesetter™ at 2400 dpi. The sensitivity, i.e. right exposure, was determined for each printing plate precursor. The sensitivity is defined as the exposure energy density (in mJ/cm²) needed to obtain (after processing) a dotgain value of 1 to 1.5% in a dot pattern with a (theoretical) dot coverage of 30% (at 200 lpi).

A sensitivity value of 150 mJ/cm² was obtained for the inventive printing plates PP-35 to PP-46 and 250 mJ/cm² for the comparative printing plate PP-47. These results indicate that the siloxanes according to preferred embodiments of the present invention result in printing plates with a significant improved sensitivity compared to the comparative printing plate.

Accelerated Press Life Test

A test field consisting of several patterns such as a uniform dot pattern with a (theoretical) dot coverage of 40% (at 200 lpi) was exposed on each printing plate at the right exposure in order to evaluate the dot loss on the printed sheet during printing. Printing was conducted on a Heidelberg GTO-46 sheetfed Press™ (available from Heidelberger Druckmaschinen AG) up to 30000 impressions, using a compressible rubber blanket Conti-Air Entropia-HC ContiTech™ and K+E Novavit 800 Skinnex Ink™ (trademark of BASF) to which 0.5 wt % of 15 micron CaCO$_3$ particles K4 Plus obtained from Manroland Benelux NV and 2% Agfa Prima FS404 fountain Solution™ additive (trademark of Agfa Graphics) was added. The dotloss % is a measure for the abrasive wear of the plate during printing and is defined as the difference between the dot coverage of the 40% pattern on printed page 1000 and the dot coverage of the 40% pattern on page 30000, divided by the dot coverage on page 1000. A high value of dotsize loss after the test, reflects a high occurrence of abrasive wear on the plate during the test.

The presslife test results obtained for the inventive printing plates PP-36 to PP-46 and comparative printing plate PP-47 are given in Table 17.

TABLE 17 presslife results of PP-36 to PP-47.

| Printing plate | Silox-xane including organosilicon compound II-2 or II-7 and organosilicon compound according to Formula I including —(O—CH2—CH2)$_n$— | | | Amount of un-saturated bonds | Comp. compound | Abrasive wear* |
|---|---|---|---|---|---|---|
| PP-36 | Silox-07 | II-2 | n = 0 | 1 | — | 54 |
| PP-37 | Silox-33 | II-2 | n = 1 | 1 | — | 44 |
| PP-38 | Silox-35 | II-2 | n = 5 | 1 | — | 18 |
| PP-39 | Silox-37 | II-2 | n = 10 | 1 | — | 22 |
| PP-40 | Silox-39 | II-2 | n = 0 | 2 | — | 26 |
| PP-41 | Silox-41 | II-2 | n = 0 | 3 | — | 40 |
| PP-42 | Silox-17 | II-7 | n = 0 | 1 | — | 20 |
| PP-43 | Silox-32 | II-7 | n = 1 | 1 | — | 14 |
| PP-44 | Silox-34 | II-7 | n = 5 | 1 | — | 11 |
| PP-45 | Silox-36 | II-7 | n = 10 | 1 | — | 9 |
| PP-46 | Silox-38 | II-7 | n = 0 | 2 | — | 13 |
| PP-47 | — | — | — | — | Albitrect CP30 and Sipomer PAM 100 | 55 |

*Dotsize loss after accelerated presslife test (%): the higher the value the more abrasive wear during printing.

The presslife test results of the printing plates including the siloxane compounds according to preferred embodiments of the present invention are significantly improved compared to the presslife test results of the reference printing plate including the comparative compounds. The results further show that siloxane compounds including an organosilicon compound according to Formula I with a longer spacer length in terms of —(O—CH$_2$—CH$_2$)$_n$—, result in plates which are less sensitive to abrasive wear: PP-36, PP-37, PP-38 and PP-39, and, PP-42, PP-43, PP-44 and PP-45. Furthermore, siloxane compounds including an organosilicon compound according to Formula I including more double bonds, result in plates which are less sensitive to abrasive wear: PP-36 compared to PP-39 and PP-41, and PP-42 compared to PP-46.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A method of preparing a negative-working lithographic printing plate precursor comprising the steps of:
providing a support having a hydrophilic surface or which is provided with a hydrophilic layer;
providing a coating on the support, the coating including a photopolymerizable layer and optionally an intermediate layer between the photopolymerizable layer and the support, the coating further including a polysiloxane present in the photopolymerizable layer and/or in the optional intermediate layer; wherein
the polysiloxane is obtained by reacting a first organosilicon compound represented by the general Formula (I) and a second organosilicon compound represented by the general Formula (II):

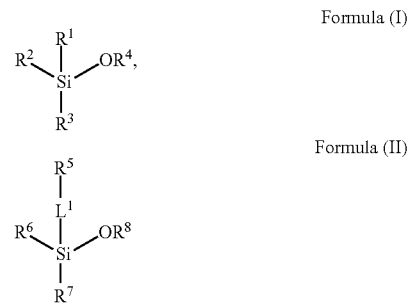

$R^1$ represents a group including at least one free radical polymerizable group;

$R^2$, $R^3$, $R^6$, and $R^7$ independently represent an alkoxy, aryloxy, or an acyloxy group, or an optionally substituted alkyl, cycloalkyl, alkenyl, alkynyl, aryl, or heteroaryl group;

$R^4$ and $R^8$ independently represent an optionally substituted alkyl, cycloalkyl, alkenyl, alkynyl, aryl, heteroaryl group, or acyl group;

$R^5$ represents a hydrophilic group selected from a carboxylic acid or a salt thereof, a sulphonic acid or a salt thereof, a sulphuric acid or a monoester or a salt thereof, a hydrocarbon group substituted with at least one hydroxyl group, an oligoalkylene oxide group, a quaternary ammonium group, a phosphonium group, or combinations thereof; and $L^1$ represents a di- or trivalent linking group; and $R^1$ and $L^1$ are bonded to the silicon atom via a carbon atom.

2. The method according to claim 1, wherein the polysiloxane is present in the photopolymerizable layer.

3. The method according to claim 1, wherein $R^1$ includes two, three, four, or five free radical polymerizable groups.

4. The method according to claim 1, wherein $L^1$ represents an alkylene, cycloalkylene, arylene, heteroarylene, —O—(CH$_2$)$_k$—, —S—(CH$_2$)$_k$—, —(CH$_2$)$_k$—O—CO—(CH$_2$)$_l$—, —CS—(CH$_2$)$_k$—, —CO—(CH$_2$)$_k$—, —O—CO—NH—, —(CH$_2$)$_k$—CO—NH—, —(CH$_2$)$_k$—NH—CO—, —NR*—CO—NH—, >N—CO—NH—, —NR*—CS—NH—, or combinations thereof;

k and l independently represent 0, 1, or an integer greater than 1; and

R* represents hydrogen or a methyl group.

5. The method according to claim 1, wherein the polysiloxane is obtained by reacting the first organosilicon compound in an amount ranging between 10 to 50 mol % with the second organosilicon compound in an amount ranging between 20 to 90 mol %.

6. The method according to claim 1, wherein the polysiloxane further includes a third organosilicon compound according to Formula (III):

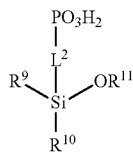

wherein $R^9$ and $R^{10}$ independently represent an alkoxy, aryloxy, or an acyloxy group, or an optionally substituted alkyl, alkenyl, alkynyl, aryl, or heteroaryl group;

$L^2$ represents a divalent linking group selected from an alkylene, cycloalkylene, arylene, heteroarylene, (poly)alkylene oxide group, —O—$(CH_2)_k$, —S—$(CH_2)_k$, —CO—$(CH_2)_k$, —$(CH_2)_k$—O—CO—$(CH_2)_l$—, —CS—$(CH_2)_k$, —CO—$(CH_2)_k$—, —O—CO—NH—, —$(CH_2)_k$—CO—NH—, —NR'—CO—NH—, —NH—CS—NH—, or combinations thereof;

k and l independently represent 0, 1, or an integer greater than 1;

R' represents hydrogen or a methyl group; and $R^{11}$ represents an optionally substituted alkyl, alkenyl, alkynyl, aryl, heteroaryl group, or acyl group.

7. The method according to claim 6, wherein the polysiloxane is obtained by reacting the first organosilicon compound in an amount ranging between 10 to 50 mol % with the second organosilicon compound in an amount ranging between 20 to 90 mol % and the third organosilicon compound in an amount ranging between 20 to 90 mol %.

8. The method according claim 1, wherein the photopolymerizable layer includes a polymerizable compound, a binder, and a polymerization initiator.

9. A method of preparing a lithographic printing plate comprising the steps of:

image-wise exposing the precursor obtained according to the method of claim 1; and developing the precursor off-press by treating the coating of the precursor with a developing solution thus removing non-exposed areas of the coating from the support.

10. The method according to claim 9, wherein the developing solution is a gum solution and the precursor is developed and gummed in one single step.

* * * * *